US010711346B2

(12) United States Patent
Winter

(10) Patent No.: US 10,711,346 B2
(45) Date of Patent: Jul. 14, 2020

(54) 6-MEMBERED CYCLIC DIENES AS STRONGLY REDUCING PRECURSORS FOR THE GROWTH OF ELEMENT FILMS BY VAPOR PHASE DEPOSITION

(71) Applicant: WAYNE STATE UNIVERSITY, Detroit, MI (US)

(72) Inventor: Charles H. Winter, Bloomfield Hills, MI (US)

(73) Assignee: Wayne State University, Detroit, MI (US)

( * ) Notice: Subject to any disclaimer, the term of this patent is extended or adjusted under 35 U.S.C. 154(b) by 0 days.

(21) Appl. No.: 15/750,290

(22) PCT Filed: Aug. 3, 2016

(86) PCT No.: PCT/US2016/045274
§ 371 (c)(1),
(2) Date: Feb. 5, 2018

(87) PCT Pub. No.: WO2017/023991
PCT Pub. Date: Feb. 9, 2017

(65) Prior Publication Data
US 2018/0230592 A1    Aug. 16, 2018

Related U.S. Application Data

(60) Provisional application No. 62/366,010, filed on Jul. 23, 2016, provisional application No. 62/200,296, filed on Aug. 3, 2015.

(51) Int. Cl.
*C23C 16/06*    (2006.01)
*C23C 16/455*    (2006.01)
(Continued)

(52) U.S. Cl.
CPC ............. *C23C 16/18* (2013.01); *C23C 16/06* (2013.01); *C23C 16/08* (2013.01);
(Continued)

(58) Field of Classification Search
CPC ........................... C23C 16/06; C23C 16/45525
See application file for complete search history.

(56) References Cited

U.S. PATENT DOCUMENTS 9,255,327 B2    2/2016 Winter et al.
2010/0104755 A1    4/2010 Dussarrat et al.
(Continued)

FOREIGN PATENT DOCUMENTS

| WO | 2008/024204 A1 | 2/2008 |
| WO | 2012/027357 A2 | 3/2012 |
| WO | 2014/133890 A2 | 9/2014 |

OTHER PUBLICATIONS

Studer, A. et al., "Silylated Cyclohexadienes as New Radical Chain Reducing Reagents: Preparative and Mechanistic Aspects," J. Am. Chem. Soc. 2003, v. 125, n. 19, pp. 5726-5733.

*Primary Examiner* — Elizabeth A Burkhart
(74) *Attorney, Agent, or Firm* — Brooks Kushman P.C.

(57) ABSTRACT

A method for reducing an atom to a reduced oxidation state includes a step of providing a vapor of a first compound having an atom in an oxidized state. A vapor of a reducing agent is provided. The reducing agent is selected from the group consisting of compounds described by formulae I, II, and III:

(Continued)

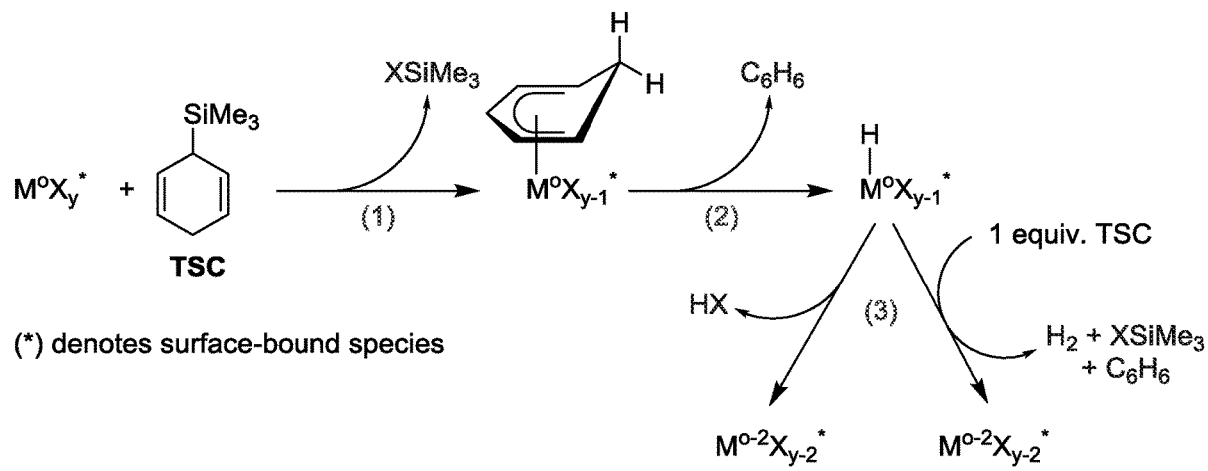

(*) denotes surface-bound species

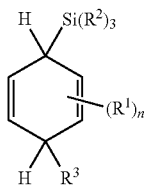

I

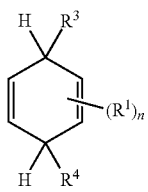

II

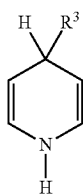

III where $R^1$, $R^2$, $R^3$, $R^4$ are each independently H, $C_{1-10}$ alkyl, $C_{6-14}$ aryl, or $C_{4-14}$ heteroaryl. The vapor of the first compound is reacted with the vapor of the reducing agent to form a second compound having the atom in a reduced state relative to the first compound.

17 Claims, 16 Drawing Sheets

(51) Int. Cl.
  *C23C 16/18*   (2006.01)
  *C23C 16/08*   (2006.01)
(52) U.S. Cl.
  CPC .. *C23C 16/45525* (2013.01); *C23C 16/45534* (2013.01); *C23C 16/45553* (2013.01)

(56) References Cited

U.S. PATENT DOCUMENTS

2012/0277456 A1\* 11/2012 Doppiu ............... A61K 31/28
                                                                556/136
2015/0004314 A1\* 1/2015 Winter ................ C01B 33/021
                                                                427/252

\* cited by examiner

7

(*) denotes surface-bound species

6-MEMBERED CYCLIC DIENES AS STRONGLY REDUCING PRECURSORS FOR THE GROWTH OF ELEMENT FILMS BY VAPOR PHASE DEPOSITION

CROSS-REFERENCE TO RELATED APPLICATIONS

This application is the U.S. national phase of PCT Appln. No. PCT/US2016/045274 filed Aug. 3, 2016 which claims the benefit of U.S. provisional application Ser. No. 62/200,296 filed Aug. 3, 2015 and U.S. provisional application Ser. No. 62/366,010 filed Jul. 23, 2016, the disclosures of which are hereby incorporated in their entirety by reference herein.

TECHNICAL FIELD

In at least one aspect, the present invention is related to the formation of metal films from "metalorganic" precursors and a reducing agent. In another aspect, the present invention is related to the reduction of metals and elements in general.

BACKGROUND

The growth of electropositive metal films from chemical precursors is extremely challenging due to the difficult reductions of the precursor metal ions and the lack of powerful reducing co-reagents that can transform the metal ions to the metals rapidly.[1,2] A significant advance in the past 10 years has been the development of atomic layer deposition (ALD) film growth processes for noble metals (Ru, Os, Rh, Ir, Pd, Pt) that entail a metalorganic metal precursor and an oxygen source ($O_2$, $O_3$) at temperatures of >200° C.[1d] The oxygen source leads to combustion of the ligands of the metal precursor, yielding an intermediate metal oxide, which then decomposes to the metal at >200° C. The key to success in these depositions is the positive electrochemical potentials of the noble metal ions ($E°>0$ V), which allow the oxide ion to reduce the metal ions to the metals. By contrast, most other metal ions in the periodic table have negative $E°$ values and are much more difficult to reduce to the metals.[1] As such, the thermal ALD growth of these metals is difficult and remains poorly developed.[1] $H_2$ has been the most commonly used reducing co-reagent to date in ALD,[1,3] but many metal ions have low reactivities toward $H_2$ at desired ALD growth temperatures of ≤250° C.[1]

$BH_3(NHMe_2)$ serves as a powerful reducing co-reagent for Ni(II), Co(II), Fe(II), Cr(II), and possibly Mn(II) α-imino alkoxide precursors in the ALD growth of these metals at ≤200° C.[2] However, these processes required a Ru substrate to decompose the $BH_3(NHMe_2)$ to more reactive reducing species, and the growth stopped once the film covered the Ru surface. The use of 1,4-bis(trimethylsilyl)-2-methyl-2,5-cyclohexadiene[4] (1) and 1,4-bis(trimethylsilyl)-1,4-dihydropyrazine[5] (2) was disclosed as precursors for the ALD growth of titanium metal and other electropositive films.[6] Precursors 1 and 2 likely react with metal halide precursors through elimination of $ClSiMe_3$ and formation of intermediate 1,4-metalla-2-methyl-2,5-cyclohexadienyl (from 1) or 1,4-metalla-1,4-dihydropyrazinyl (from 2) complexes, which then eliminate aromatic toluene or pyrazine and thereby reduce the metal centers by 2 electrons per ligand. Precursors 1 and 2 have allowed the first thermal ALD growth of titanium metal films (Ti(II)↔Ti(0), $E°=-1.631$ V),[6c] and should also lead to the ALD growth of many other electropositive metal films. However, precursors 1 and 2 likely require metal halide precursors, many of which are corrosive. Additionally, $ClSiMe_3$ is produced in the deposition chemistry (FIG. 1), which may also be corrosive toward metal films.

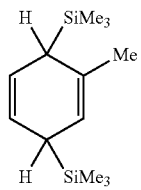

1

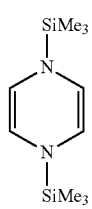

2

Accordingly, there is a need for improved reducing agents for ALD and CVD processes.

SUMMARY

The present invention solves one or more problems of the prior art by providing in at least one embodiment a method for reducing an atom to a reduced oxidation state, and in particular, to the 0 oxidation state. The method includes a step of providing a vapor of a first compound having an atom in an oxidized state, the atom in an oxidized state being in an oxidation state greater than 0. The atom in an oxidized state is selected from the group consisting of Groups 2-14 of the Periodic Table, the lanthanides, As, Sb, Bi, and Te. A vapor of a reducing agent is provided. The reducing agent is selected from the group consisting of compounds described by formulae I, II, III, and IV:

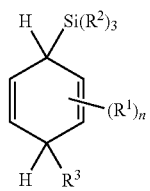

I

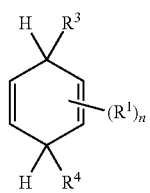

II

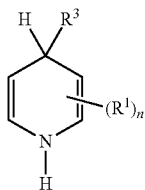

III

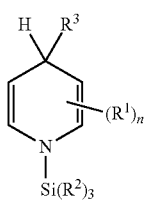

IV wherein, $R^1$, $R^2$ $R^3$, $R^4$ are each independently H, $C_{1-10}$ alkyl, $C_{6-14}$ aryl, or $C_{4-14}$ heteroaryl; and n is 0, 1, 2, 3, or 4. The vapor of the first compound is reacted with the vapor of the reducing agent to form a second compound having the atom in a reduced state relative to the first compound.

DETAILED DESCRIPTION

Figure 1:
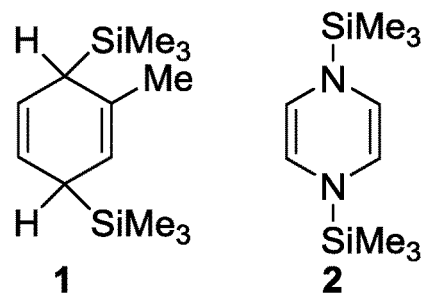
FIG. 1: ALD precursors (prior art).

Reference will now be made in detail to presently preferred compositions, embodiments, and methods of the present invention which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; "R" groups include H, $C_{1-10}$ alkyl, $C_{2-10}$ alkenyl, $C_{6-14}$ aryl (e.g., phenyl, halo, or $C_{4-14}$ heteroaryl); single letters (e.g., "n", "o", "p", etc.) are 1, 2, 3, 4, or 5; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

The terms "comprising", "consisting of", and "consisting essentially of" can be alternatively used. When one of these three terms is used, the presently disclosed and claimed subject matter can include the use of either of the other two terms.

The term "alkyl" as used herein means $C_{1-10}$, linear, branched, saturated or at least partially and in some cases fully unsaturated (i.e., alkenyl and alkynyl) hydrocarbon chains, including for example, methyl, ethyl, propyl, isopropyl, butyl, isobutyl, tert-butyl, pentyl, hexyl, octyl, ethenyl, propenyl, butenyl, pentenyl, hexenyl, octenyl, butadienyl, propynyl, butynyl, pentynyl, hexynyl, heptynyl, and allenyl groups. In a refinement, $C_{1-10}$ alkyl has 1, 2, 3, 4, 5, 6, 7, 8, 9, or 10 carbon atoms which is optionally substituted with Cl, F, Br, nitro or the like.

The term "aryl" as used herein means an aromatic substituent that can be a single aromatic ring, or multiple aromatic rings that are fused together, linked covalently, or linked to a common group, such as, but not limited to, a methylene or ethylene moiety. The common linking group also can be a carbonyl, as in benzophenone, or oxygen, as in diphenylether. Examples of aryl include, but are not limited to, phenyl, naphthyl, biphenyl, and diphenyl ether, and the like. Aryl groups include heteroaryl groups, wherein the aromatic ring or rings include a heteroatom (e.g., N, O, S, or Se). Exemplary heteroaryl groups include, but are not limited to, furanyl, pyridyl, pyrimidinyl, imidazoyl, benzimidazolyl, benzofuranyl, benzothiophenyl, quinolinyl, isoquinolinyl, thiophenyl, and the like. The aryl group can be optionally substituted (a "substituted aryl") with one or more aryl group substituents, which can be the same or different, wherein "aryl group substituent" includes alkyl (saturated or unsaturated), substituted alkyl (e.g., haloalkyl and perhaloalkyl, such as but not limited to —$CF_3$), cycloalkyl, aryl, substituted aryl, aralkyl, halo, nitro, hydroxyl, acyl, carboxyl, alkoxyl (e.g., methoxy), aryloxyl, aralkyloxyl, thioalkyl, thioaryl, thioaralkyl, amino (e.g., aminoalkyl, aminodialkyl, aminoaryl, etc.), sulfonyl, and sulfinyl.

Throughout this application, where publications are referenced, the disclosures of these publications in their entireties are hereby incorporated by reference into this application to more fully describe the state of the art to which this invention pertains.

Abbreviations:
"ALD" means atomic layer deposition.
"CVD" means chemical vapor deposition.
"PDMAT" means pentakis(dimethylamido)tantalum(V).
"XPS" means X-ray photoelectron spectroscopy.

Figure 2A:
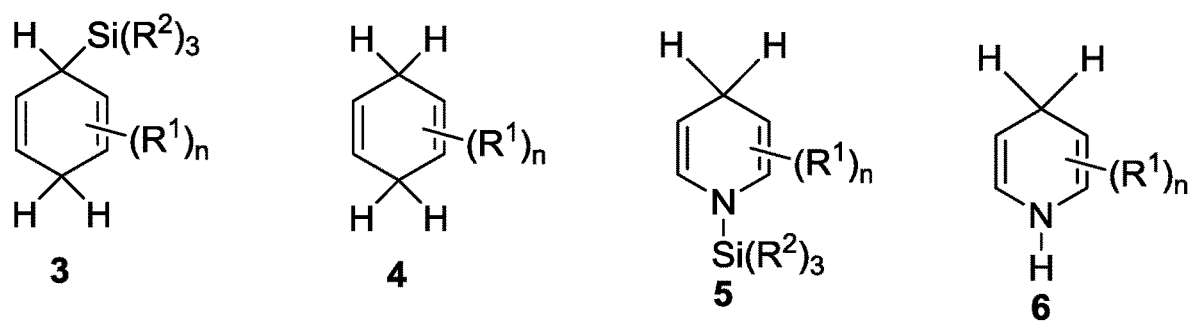
FIG. 2A: Chemical structure for reducing agents.
Figure 2B:
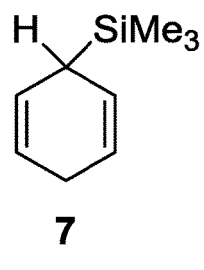
FIG. 2B: Chemical structure for 1-trimethylsilyl-2,5-cyclohexadiene (TSC).

The present invention provides alternate classes of reducing agents for the ALD and CVD growth of element films. As shown in FIG. 2A, and described below, cyclic dienes of the general formulas 3-6 function as strongly reducing precursors for the formation of electropositive metal thin films by ALD and other vapor phase film growth techniques. Silylated diene 7 (FIG. 2B) has been shown to serve as a source of "$HSiMe_3$" in the hydrosilylation of alkenes that is catalyzed by $B(C_6F_5)_3$.[7] In these reactions, $B(C_6F_5)_3$ is proposed to remove a hydride from the $sp^3$ carbon atom opposite of the silylated carbon atom, producing $[SiMe_3(C_6H_6)]^+[HB(C_6F_5)_3]^-$, which then can react with alkenes to afford the hydrosilylation product, benzene, and $B(C_6F_5)_3$. Diene 7 was previously shown to serve as an efficient radical chain reducing agent for hydrogen atom transfer to $R_3C\bullet$ to afford $R_3CH$.[8] Diene 7 and numerous analogs can be easily prepared by deprotonation of 1,4-cyclohexadiene with tBuLi, followed by treatment with $ClSiR_3$.[7,c8]

Figure 3:
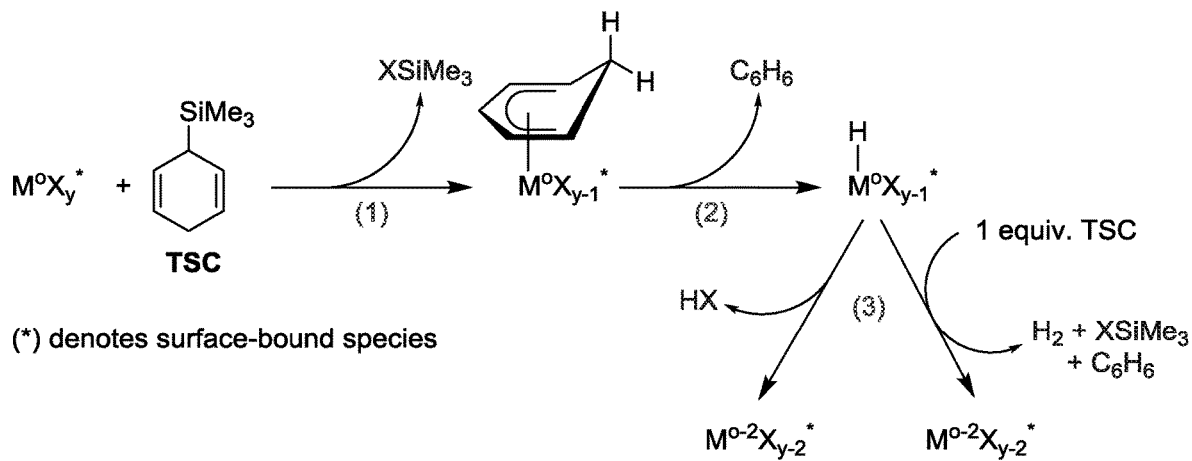
FIG. 3: Possible reduction mechanism for TSC.

Structures of the general formula 3 and 5 react with a metal precursor $M^oX_y$ (X=monoanionic ligand, o is an integer (e.g., 1, 2, 3, 4, 5, or 6), or 4, y is 0, 1, 2, 3, or 4; other can also work equally well) to form the metals. As outlined in FIG. 3, parent compound 7 can react with $M^oX_y$ by elimination of $XSiMe_3$, to afford an intermediate 1-metalladienyl intermediate, which should then transfer the 4-hydrogen atom of the 1-metalladienyl ligand to the metal to form a highly stable aromatic compound and "$HM^oX_{y-1}$". "$HM^oX_{y-1}$" can then reductively eliminate HX to form the metal ($M^{o-2}X_{y-2}$) or can react with another equivalent of 7 to afford $M^{o-2}X_{y-2}$, which can then reductively eliminate $H_2$ to form the metal releasing $H_2$, $XSiMe_3$ and $C_6H_6$. By analogy, $M^oX_y$ could react with 4 and 6 by sequential HX elimination to form intermediate "$HM^oX_{y-1}$" or $M^oX_y$ species, which can reductively eliminate HX or $H_2$ to form the metals. In all cases, formation of highly stable aromatic compounds provides a strong driving force for metal reduction. The metal hydrides are unstable[9] and decompose rapidly to the metals.

In a refinement, compounds 3-7 react with metal complexes chosen from Ti, Ta, Mo, W, Mn, and Al. In previous studies[2], solution reactions between a metal precursor and potential reductants were studied. In cases where the metal powders are not too reactive, they are isolated and identified by X-ray powder diffraction. Powders of the most electropositive metals (e.g., Ti, Al) may be too reactive to allow isolation and identification by X-ray powder diffraction.[6c] However, establishing rapid solution reactions is a promising step toward viable ALD and CVD chemistry. In the present project, the reactivity of metal chlorides $MCl_n$ with 3-7 in an aprotic organic solvent to assess the formation of metal powders and also how rapidly the powders form will be examined. For useful low temperature ALD processes, the precursors should react within a few minutes of mixing at ambient temperature to afford the metal powders.[1a,2,6] Rapid reactions between precursors are required to achieve efficient ALD growth. Additionally, screening of metalorganic precursors such as $M(NMe_2)_n$ (M=Ti, Ta, Mo, W, Al), $M(NtBu)_2(NMe_2)_2$ (M=Mo, W), $Mn(N(SiMe_3)_2)_2$, and $AlR_3$ for their solution reactivity toward 3-7 will be conducted. The goal in this section will be to identify reactant pairs chosen from the metal precursors and 3-7 that react rapidly at room temperature to afford metal powders.

Advantageously, the present invention provides thermally stable reducing precursors based on 3-7, deposition conditions for the growth of metallic Ti, Ta, Mo, W, Mn, and Al films, as well as initial film growth parameters and materials properties for these films.

In an embodiment, a method for reducing an atom to a reduced oxidation state, and in particular, to the 0 oxidation state is provided. The method includes a step of providing a vapor of a first compound having a reducible atom. In a variation, the reducible atom is an atom in an oxidized state. Typically, the atom in an oxidized state is in an oxidation state greater than 0. In one refinement, the atom in an oxidized state is selected from the group consisting of Groups 2-14 of the Periodic Table, the lanthanides, As, Sb, Bi, and Te. In one refinement, the atom in an oxidized state is selected from the group consisting of Groups 2-12 of the Periodic Table, the lanthanides, As, Sb, Bi, and Te. In another refinement, the reducible atom is an electropositive element atom or electropositive cation ion (e.g., cation) (Eo<0 V). In another refinement, the reducible atom is an ion (i.e., with Eo>0 V). A vapor of a reducing agent is provided. The reducing agent is selected from the group consisting of compounds described by formulae I, II, III, and IV:

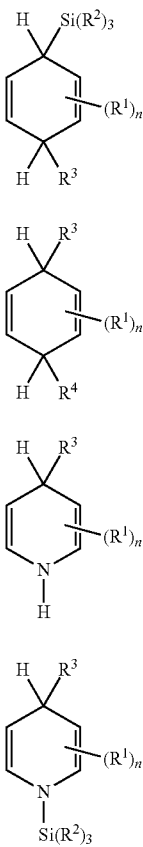

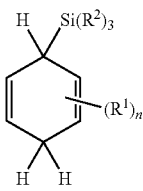

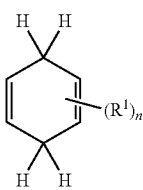

wherein, $R^1$, $R^2$, $R^3$, $R^4$ are each independently H, $C_{1-10}$ alkyl, $C_{6-14}$ aryl, or $C_{4-14}$ heteroaryl; and n is 0, 1, 2, 3, or 4. In a refinement, $R^1$, $R^2$, $R^3$, $R^4$ are each independently H or $C_{1-10}$ alkyl. In another refinement, $R^3$, $R^4$ are each independently H. In a variation, the reducing agent has formulae I, II, or III. In a refinement, the reducing agent is described by formulae 3-6;

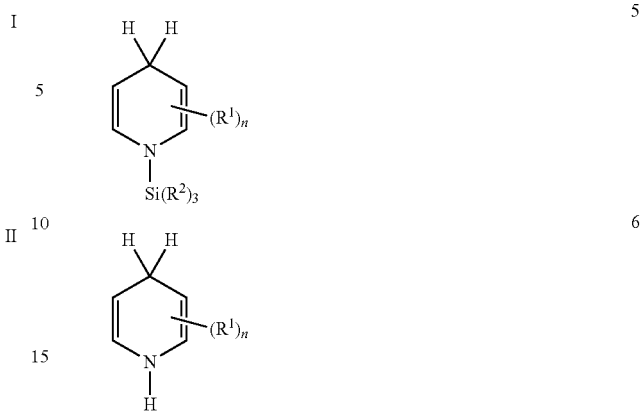

In still another variation, the reducing agent is described by formulae 3, 4, or 6. The vapor of the first compound is reacted with the vapor of the reducing agent to form a second compound having the atom in a reduced state relative to the first compound. It should be appreciated that this reaction can be accomplished in an atomic layer deposition process or a chemical vapor deposition process. The present reaction can be carried out either in solution, at a substrate surface (e.g., ALD, CVD), or in the vapor phase (e.g., CVD) at temperatures from about 50 to 400° C. In another refinement, the reaction is carried out at temperatures from about 75 to 200° C. Similarly, the pressure for forming the metal is set at a value suitable to the properties of the chemical precursors and film to be formed. In one refinement, the pressure is from about $10^{-6}$ torr to about 760 torr. In another refinement, the pressure is from about 0.1 millitorr to about 10 torr. In still another refinement, the pressure is from about 1 to about 100 millitorr. In yet another refinement, the pressure is from about 1 to 20 millitorr.

In a refinement, the atom in an oxidized state is selected from the group consisting of Groups 2-14 of the Periodic Table, the lanthanides, As, Sb, Bi, and Te. In a refinement, the atom in an oxidized state includes atoms from this group having a standard electrode potential greater than −2.4 V relative to a reference electrode potential (e.g., standard hydrogen electrode or a standard $Ag/AgNO_3$ electrode). In particular, such atoms are selected from the group consisting of Groups 3-14 of the Periodic Table, the lanthanides, As, Sb, Bi, and Te. In a variation, the atom in an oxidized state (e.g., M is the formulae set forth herein) is a transition metal. Examples of useful transition metals include, but are not limited to, Cu, Ni, Co, Cr, Mn, Fe, W, Mo, Ti, Zr, Hf, Rf, V, Nb, Ta, Re, Ru, Rh, Ir, Pd, Pt, and Au.

Particularly useful examples for the atom in an oxidized state include, but are not limited to, Cr(II), Mn(II), Fe(II), Co(II), and Ni(II). In a refinement, the atom in an oxidized state is a transition metal selected from groups 3-7 of the periodic table. The compounds with an atom in an oxidized state include an atom in an oxidation state greater than 0 (e.g., 1, 2, 3, 4, 5, or 6). Typically, the compounds with an atom in an oxidized state are metal-containing compounds. Useful metal-containing compounds are organometallic compounds and metal halides with vapor pressures sufficient for ALD or CVD processes. In a refinement, the compounds containing an atom in an oxidized state have vapor pressures of at least 0.01 torr at 100° C. In a further refinement, the compounds containing an atom in an oxidized state have vapor pressures of at least 0.05 torr to about 700 torr at 100° C.

As set forth above, the first compound includes an atom in an oxidized state can be selected from Groups 2-14 of the Periodic Table, the lanthanides, As, Sb, Bi, and Te. In particular, the atom in an oxidized state is in an oxidation state of +1, +2, +3, +4, +5, or +6. In a refinement, the atom in an oxidized state is a transition metal. Particularly useful examples of the atom in an oxidized state include, but are not limited to, Cu, Cr, Mn, Fe, Co, Ti, or Ni.

Although the present invention is not limited by the type of the first compound that includes an atom in an oxidized state, compounds of the following structures are particularly useful:

$$ML_p$$

$$ML_pY_m$$

wherein M is a reducible atom and in particular, an atom in an oxidized state as set forth above. In particular, M is an atom selected from Groups 2-14 of the Periodic Table, the lanthanides, As, Sb, Bi, and Te; L is an anionic ligand; p is the number of anionic ligands; Y is a neutral ligand and m is the number of neutral ligands. Examples for Y include, but are not limited to, 2,2'-Bipyridine, $H_2O$, $CH_3CN$, $C_5H_5N$ (pyridine), CO, ethylenediamine, 1,10-phenanthroline, $PPh_3$, $NH_3$, and the like. Typically, n will be of sufficient number to neutralize any charge on M. In a refinement, p is from 1 to 6 and m is from 1 to 5. Examples for L include optionally-substituted cyclopentadienyl, optionally-substituted β-diketonates, optionally-substituted amidinates, optionally-substituted guanidinates, optionally-substituted β-aminoalkoxides, optionally-substituted allyls, and optionally-substituted tris(pyrazolyl)borates.

In a variation, the first compound having an atom in an oxidized state is diazadiene compound described by the following formula:

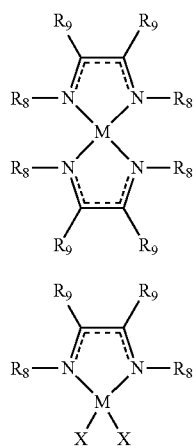

wherein M is a reducible atom and in particular, an atom in an oxidized state as set forth above. In particular, M is a transition metal selected from Groups 3-10 of the Periodic Table, Ru, Pd, Pt, Rh, and Ir; In a refinement, M are the atoms in an oxidized state as set forth above; $R_8$ is $C_1$-$C_{12}$ alkyl, amino (i.e., —$NH_2$), or $C_6$-$C_{18}$ aryl; $R_9$ is hydrogen, $C_1$-$C_{10}$ alkyl, $C_6$-$C_{18}$ aryl, amino, $C_1$-$C_{12}$ alkylamino, or $C_2$-$C_{22}$ dialkylamino and X is Cl, Br, or I. In a refinement, M is Mg, Al, Ti, V, Cr, Mn, Fe, Co, Ni, Cu, Zn, Sn, or Sb. In another refinement, when the metal-containing compound has formula II, M is Cr, Mn, Fe, Ni, Co, Zn, Al, or Mg. In still another refinement, M is Mg, Al, Sn, or Sb. In a useful variation, the $C_{2-5}$ diketone is a 1,3-diketone. It should be appreciated that the reaction of the present embodiment can be in the gas or liquid phases. In other variations, the reaction is an ALD reaction as set forth below. Additional details of this variation are set forth in U.S. Pat. No. 9,255,327; the entire disclosure of which is hereby incorporated by reference.

In another variation, the first compound having an atom in an oxidized state is described by the following formula:

$$M((NR_{10})_2)_p$$

wherein, M is a reducible atom and in particular, an atom in an oxidized state as set forth above. In particular, M is a metal selected from Groups 2-14 of the Periodic Table, the lanthanides, As, Sb, Bi, and Te or the subgroups for the atom in an oxidized state set forth above; $R_{10}$ is $C_{1-6}$ alkyl, $Si(R_{11})_3$; $R_{11}$ is $C_{1-6}$ alkyl, and p is 2, 3, 4, 5, or 6.

In another variation, the first compound having an atom in an oxidized state is described by the following formula:

$$M(OR_{10})_p$$

wherein, M is a reducible atom and in particular, an atom in an oxidized state as set forth above. In particular, M is a metal selected from Groups 2-14 of the Periodic Table, the lanthanides, As, Sb, Bi, and Te or the subgroups for the atom in an oxidized state set forth above; $R_{10}$ is $C_{1-6}$ alkyl; and p is 2, 3, 4, 5, or 6.

In another variation, the first compound having an atom in an oxidized state is β-diketone compounds described by the following formula:

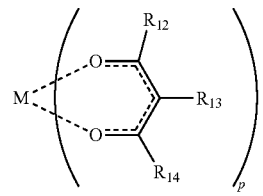

wherein, M is a reducible atom and in particular, an atom in an oxidized state as set forth above. In particular, M is a metal selected from Groups 2-14 of the Periodic Table, the lanthanides, As, Sb, Bi, and Te or the subgroups for the atom in an oxidized state set forth above; $R_{12}$, $R_{13}$, $R_{14}$ are independently H, $C_{1-10}$ alkyl, $C_{1-8}$ perfluoroalkyl, $CF_3$, $C_{1-10}$ polyether groups, and the like; and p is 2, 3, 4, 5, or 6.

In another variation, the first compound having an atom in an oxidized state is amidinate compounds described by the following formula:

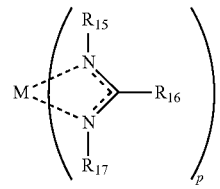

wherein, M is a reducible atom and in particular, an atom in an oxidized state as set forth above. In particular, M is a metal selected from Groups 2-14 of the Periodic Table, the lanthanides, As, Sb, Bi, and Te or the subgroups for the atom in an oxidized state set forth above; $R_{15}$, $R_{16}$, $R_{17}$ are independently H, $C_{1-10}$ alkyl, $C_{1-8}$ perfluoroalkyl, $CF_3$, $C_{1-10}$ polyether groups, and the like; and p is 1, 2, 3, 4, 5, or 6.

Specific examples for the compounds including an atom in an oxidized state include, but are not limited to, $Ag_2(tBu_2\text{-amd})_2$, $Al(CH_3)_3$, $Al(NMe_2)_3$, $Al_2(NMe_2)_6$, $Al_2(C_2H_5)_4(\mu\text{-}C_2H_5)_2$, $AlMe_2(OiPr)$, $Ba(thd)_2$, $Ca(tBu_2amd)_2$, $Ce(thd)_4$, $Co_2(CO)_6(C_2R_2)$, $Co(C_5H_5)_2$, $CpCo(CO)_2$, $CoCp(C_6Me_6)$, $Co(C_6Me_6)_2$, $CpCo(CO)_2)$, $Co(acac)_2$, $Co(acac)_3$, $Co(iPr_2amd)$, $Co(thd)_3$, $Co(thd)_2$, $Co(tBuEtamd)_2$, $Co(tBuEtpmd)_2$, $CrCp_2$, $Cr(acac)_3$, $Cr(Et_2amd)_3$, $Cu_2(iPr_2amd)_2$, $Cu(hfac)_2$, $Cu(hfac)_2$, $Cu(thd)_2$, $Dy(thd)_3$, $Fe(iPr_2amd)_2$, $Er(tBu_2amd)_3$, $Fe(tBuEtamd)_2$, $Fe(thd)_3$, $Ga(Et_2amd)_3$, $Gd(iPr_2amd)_3$, $Gd(thd)_3$, $HfCl_4$, $Hf(OtBu)_4$, $Hf(mmp)_4$, $Hf(Me_2fmd)_4$, $Hf(Me_2\text{-}pmd)_4$, $Hf(Me_2bmd)_4$, $Ho(thd)_3$, $Ir(acac)_3$, $La(thd)_3$, $La[N(SiMe_3)_2]_3$, $La(iPr_2fmd)_3$, $La(tBu_2fmd)_3$, $Lu(Et_2fmd)_3$, $Lu(Et_2amd)_3$, $Mg(tBu_2amd)_2$, $Mg(iPr_2amd)_2$, $Mn(thd)_3$, $Mn(EtCp)_2$, $Mo(Mes)(CO)_3$, $Nb(OEt)_5$, $Ni(dmamp)_2$, $Ni(tBu_2amd)$, $Pb(OtBu)_2$, $Pr(iPr_2amd)_3$, $Si(OEt)_4$, $Si(OtBu)_3OH$, $Si(OtPe)_3OH$, $Ta(OEt)_5$, $Ti(iPr_2amd)_3$, $Ti(OMe)_4$, $Ti(OEt)_4$, $Ti(OiPr)_4$, $Nd(thd)_3$, $Ni(acac)_2$, $Ni(thd)_2$, $Pb(thd)_2$, $Er(thd)_3$, $Eu(thd)_3$, $Fe(acac)_3$, $Ru(thd)_3$, $Ru(od)_3$, $Ru(tBu_2amd)_2(CO)_2$, $Sc(thd)_3$, $Sc(Et_2amd)_3$, $Sr(tBu_2amd)_2$, $Sm(thd)_3$, $Sr(thd)_2$, $Sr(methd)_2$, $Tm(thd)_3$, $Y(thd)_3$, $Mg(thd)_2$, $Hf(NMe_2)_4$, $Hf(NEtMe)_4$, $Hf(NEt_2)_4$, $Pr[N(SiMe_3)_2]_3$, $Sb(NMe_2)_3$, $Ru(EtCp)_2$, $TiCl_4$, $NiCp_2$, $Sr(Me_5Cp)_2$, $Ta(NMe_2)_5$, $Ta(NEt_2)_5$, $Ta(NtBu)(NEt_2)_3$, $Ti(NMe_2)_4$, $Ti(NEtMe)_4$, $V(Et_2amd)_3$, $V(iPr_2amd)_3$, $WF_6$, $W(NtBu)_2(NMe_2)_2$, $Y(iPr_2amd)_3$, $Zn[N(SiMe_3)_2]_2$, $Zn(CH_2CH_3)_2$, $Zn(iPr_2amd)_3$, $Zn(iPr_2amd)_2$, $Zr(Me_2amd)_4$, $Zr(Me_2fmd)_4$, $Zr(Me_2bmd)_4$, $Zr(Me_2pmd)_4$, $Zr(NMe_2)_4$, $Zr(NEtMe)_4$, $Zr(NEt_2)_4$, $ZrCp_2Me_2$, $Al(OR)_3$, $SiH_2(NR_2)_2$, $SiH(NR_2)_3$, $Si_2Cl_6$, $Si_3Cl_8$, $Ti(NMe_2)_4$, $Ti(NMeEt)_4$, $Ti(NEt_2)_4$, $CpTi(NMe_2)_3$, $(2\text{-tBuallyl})Co(CO)_3$, where R is $C_{1-6}$ alkyl. Additional examples include, but are not limited to Cp and substituted versions of Ni, Co, Fe, Mn, Cr, Cu alkoxides with beta-amino groups, $TiBr_4$, $TiI_4$, $TiF_4$, halides and pseudohalides of Nb(V), Ta(V), Mo(IV), Mo(V), Mo(VI), W(IV), W(V), W(VI), Al(III), Si(IV), Ge(IV), Ge(II), Sn(II), Sn(IV), Sb(III), Sb(V), $Al(NMe_2)_3$, volatile Si(IV) compounds, volatile Si(IV) hydrides, volatile Ge(IV) compounds, volatile Ge(IV) hydrides, and halides of Se and Te.

In another refinement of the present embodiment, a method for forming a metal is provided. This method includes the steps set forth above in which a first compound is reacted with a second compound. In this context, the formed metal is characterized as having metal atoms in the zero oxidation state. The present refinement can be carried out either in solution, at a substrate surface (e.g., ALD, CVD), or in the vapor phase (e.g., CVD) at temperatures from about 50 to 400° C. In another refinement, the metal deposition is carried out at temperatures from about 75 to 200° C. Similarly, the pressure for forming the metal is set at a value suitable to the properties of the chemical precursors and film to be formed. In one refinement, the pressure is from about $10^{-6}$ torr to about 760 torr. In another refinement, the pressure is from about 0.1 millitorr to about 10 torr. In still another refinement, the pressure is from about 1 to about 100 millitorr. In yet another refinement, the pressure is from about 1 to 20 millitorr.

In a variation refinement, a method of forming an element film (e.g., a metal film by an ALD process) is provided. Additional details of ALD process applicable to this refinement are found in U.S. Pat. No. 9,255,327; the entire disclosure of which is hereby incorporated by reference. The method comprises a deposition cycle which includes contacting the substrate with vapor of a first compound having an atom in an oxidized state as set forth above such that at least a portion of the vapor of the first compound adsorbs or reacts with a substrate surface to form a modified surface. Typically, this contacting step is accomplished with a first pulse time. The deposition cycle further includes contacting the modified surface with a vapor of the reducing agents set forth above to react and form at least a portion of the element (e.g., metal) film. Typically, each of these steps is performed at a temperature from about 50 to 400° C. In a refinement, each of these steps is performed at a temperature from about 75 to 200° C. The present reaction is used in an ALD process as set forth below. Similarly, the pressure during film formation is set at a value suitable to the properties of the chemical precursors and film to be formed. In one refinement, the pressure at which these steps are performed is from about $10^{-6}$ torr to about 760 torr. In another refinement, the pressure at which these steps are performed is from about 0.1 millitorr to about 10 torr. In still another refinement, the pressure is from about 1 to about 100 millitorr. In yet another refinement, the pressure is from about 1 to 20 millitorr. In a variation, the method purge includes a first purging step lasting a first purge time after the substrate is contact with the vapor of the first compound and a second purging step lasing a second purge time after the modified substrate is contacted with the vapor of the reducing agent.

In a refinement, the method for forming an element film further includes at least one additional deposition cycle comprising sequentially contacting the substrate with the vapor of the first compound and then the vapor of the reducing agent. In some refinements, the substrate is contacted for a plurality of additional deposition cycles. For example, the substrate may be contacted with from 1 to several thousand deposition cycles depending on the thickness of the film desired. In particular, the substrate is contacted with the vapor of the first compound having an atom in an oxidized state and then the vapor of the reducing agent for 1 to 5000 deposition cycles. In another refinement, the substrate is contacted with the vapor of the first compound having an atom in an oxidized state and then the vapor of the reducing agent for 10 to 2000 deposition cycles. In still another refinement, the substrate is contacted with the vapor of the first compound having an atom in an oxidized state and then the vapor of the reducing agent for 20 to 1000 deposition cycles.

Pulse times and purge times also depend on the properties of the chemical precursors and the geometric shape of the substrates. Thin film growth on flat substrates uses short pulse and purge times, but pulse and purge times in ALD growth on 3-dimensional substrates can be very long. Therefore, in one refinement, pulse times and purge times are each independently from about 0.0001 to 200 seconds. In another refinement, pulse and purge times are each independently from about 0.1 to about 10 seconds.

These examples illustrate the various embodiments of the present invention. Those skilled in the art will recognize many variations that are within the spirit of the present invention and scope of the claims.

1. EXPERIMENTATION

Diene 7,1-Trimethylsilyl-2,5-cyclohexadiene (TSC) (FIG. 2B) is used to facilitate film growth. To date metallic film growth has been demonstrated and analyzed for $TaCl_5$. Film growth has been demonstrated for $MoCl_5$, PDMAT, and $AlMe_3$.

A. ALD Film Growth for TSC+SbCl$_3$

Initial ALD film growth trials involving TSC and SbCl$_3$ showed no growth for Ru, Co, Pd, SiO$_2$, and H-terminated Si. There was minimal particle grown on Si(100). Large droplets were observed on Pt at 180° C. and evident growth was observed on Cu. These initial experiments were carried out by TSC pulse (1 s) and TSC purge (5 s) delivered by a bubbler at room temperature followed by SbCl$_3$ pulse (5 s) and SbCl$_3$ purge (10 s) delivered by a solid state booster at 45° C.

On the copper substrate TSC temperature and pulse length were varied to see the effect of pulse length. SbCl$_3$ pulse (5 s) and purge 10 (s) remained unchanged and was delivered at 45° C. At 120° C. and 180° C., a 1 s TSC pulse produced discontinuous particles. At 240° C. a 1 s TSC pulse produced 10 nm film alloyed with Cu and some nanowires, while a 5 s TSC pulse produced a 10 nm film with a rough crystalline particle surface. At 260° C., a 3 s TSC pulse produced 5-10 nm film with long nanowires. Additional experiments were conducted varying TSC pulse and purge length, SbCl$_3$ pulse and purge length, and temperature. Results are shown in Table 1 below.

booster. Experiments used WSU2-Picosun R-75BE ALD Reactor with Load Lock, a Texol GeniSys nitrogen generator (99.999%) and a SAES In-line gas purifier (99.99999+%). TSC was delivered by vapor draw ampoule at ambient temperature. Cycles comprised TaCl$_5$ pulse (5 s), TaCl$_5$ purge (10 s), TSC pulse (1 s), TSC purge (5 s). TSC pulse and purge were conducted at 120° C. on 100 nm of SiO$_2$/Si. After 3000 cycles, approximately 1300 nm film resulted with a growth of 4.3 Å per cycle. TSC consumption was 0.13 mg per cycle. CVD-like growth was observed due to the large TaCl$_5$ pulse. Additional experiments were carried out with 1000 cycles comprising TaCl$_5$ pulse (2 s), TaCl$_5$ purge (10 s), TSC pulse (1 s), TSC purge (5 s). TSC pulse and purge were conducted at 140° C. on 100 nm of SiO$_2$/Si. An average 22.8 nm film resulted with a growth rate of 0.228 Å per cycle. Additional experiments were carried out with TaCl$_5$ pulse (2 s), TaCl$_5$ purge (10 s), TSC pulse (1 s), TSC purge (5 s) for 100 cycles on 100 nm SiO$_2$/Si. Experiments were conducted at various TSC temperatures.

i) Lower Purity Carrier Gas Study

Low purity carrier gas experiments followed a cycle comprising TaCl$_5$ pulse (2 s), TaCl$_5$ purge (10 s), TSC pulse

TABLE 1

ALD results at various temperatures with different purge and pulse lengths

| T (° C.) | TSC 0.1 s/3 s SbCl$_3$ 3 s/3 s | TSC 1 s/2 s SbCl$_3$ 1 s/2 s | TSC 1 s/3 s SbCl$_3$ 3 s/3 s | TSC 1 s/5 s SbCl$_3$ 5 s/10 s | TSC 3 s/5 s SbCl$_3$ 5 s/10 s | TSC 5 s/10 s SbCl$_3$ 5 s/10 s |
|---|---|---|---|---|---|---|
| 100 | | | 20 nm film Few rough particles | | | |
| 120 | Rough, uneven particle growth | | Rough continuous film (~44 nm) (w/nucleation step) | Rough, nearly continuous film | | Rough, uneven particle growth |
| 150 | | Rough, nearly continuous film (~42 nm) | Rough, nearly continuous film (~45 nm) | | | |
| 180 | | | | Discontinuous particles | | |
| 210 | | | | Light disperse particles | Light disperse particles | |
| 240 | | | Very rough, large crystallites, no apparent alloy | 10 nm alloyed film, some nanowires | 10 nm alloyed film, rough crystalline particle surface | |
| 260 | | | | | 5-10 nm alloyed film, long nanowires | |
| 300 | | | | | Possibly thin alloyed film, very long nanowires | |

B. ALD Film Growth for TSC+TaCl$_5$ on SiO$_2$/Si Substrate

Two ALD studies using TSC were conducted. The first study involved lower purity carrier gas (~99.999% N$_2$). The second study involved higher purity carrier gas (>99.99999% N$_2$). Extremely high purity carrier gas is essential for ALD of highly electropositive metals. Experiments used a SiO$_2$/Si substrate.

Figure 4:
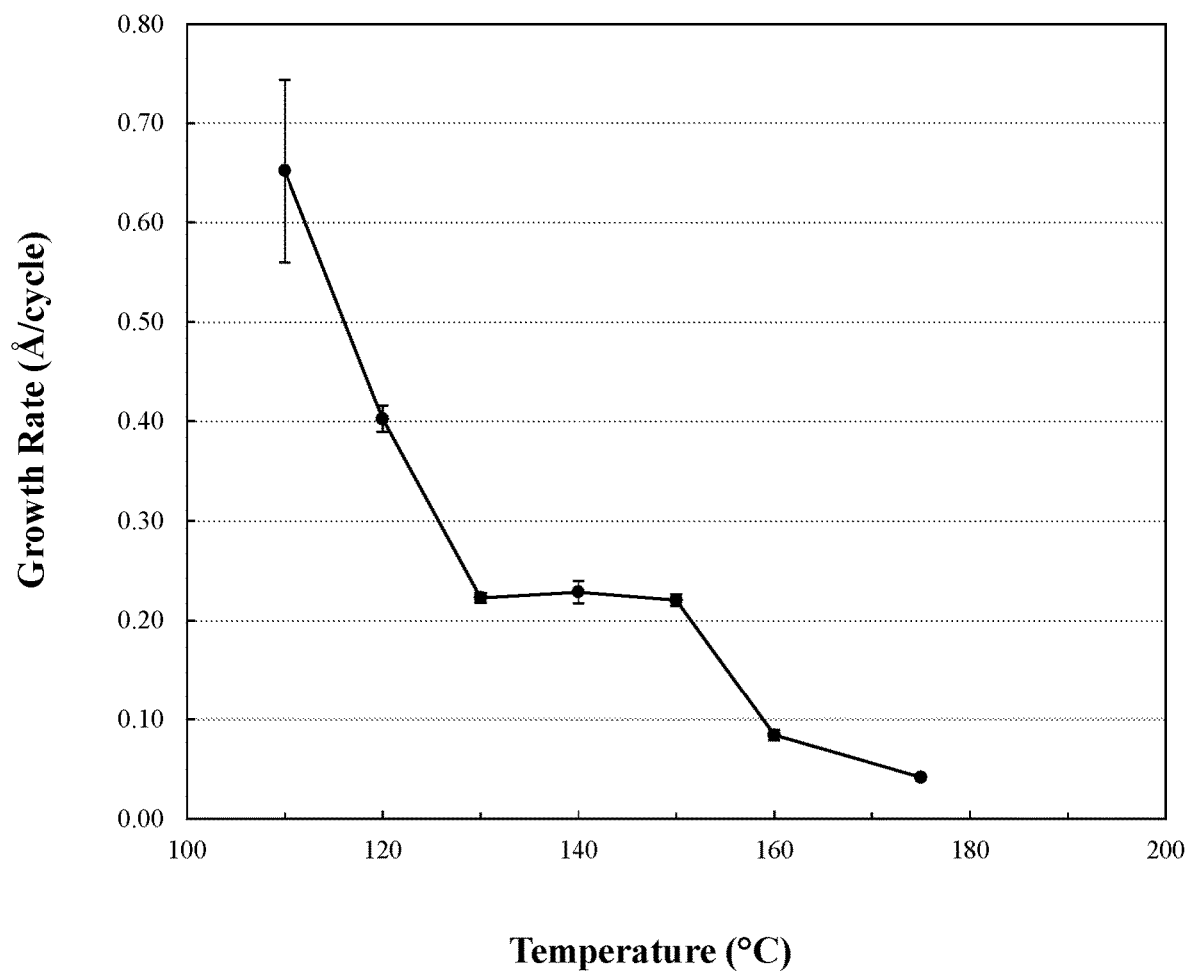
FIG. 4: Relationship between growth rate and temperature on $SiO_2$ using lower purity carrier gas.

TSC was delivered at ambient temperature by vapor draw ampoule and TaCl$_5$ was delivered at 100° C. by solid-state (1 s), and TSC purge (10 s). TSC ampoules are delivered at 23° C. TaCl$_5$ is delivered at 100° C. After 1000 cycles, samples exhibited a growth rate ~0.21 Å per cycle at 140° C. Films were amorphous by X-ray powder diffraction (XRD) and non-conductive by four-point probe. Additional experiments were conducted as different temperatures. Growth rate decreased as temperature increased (FIG. 4).

Additional experiments were conducted varying TSC pulse length. Each cycle comprised TaCl$_5$ pulse (2 s), TaCl$_5$ purge (10 s), TSC pulse (varying length), TSC purge (5 s).

Figure 5:
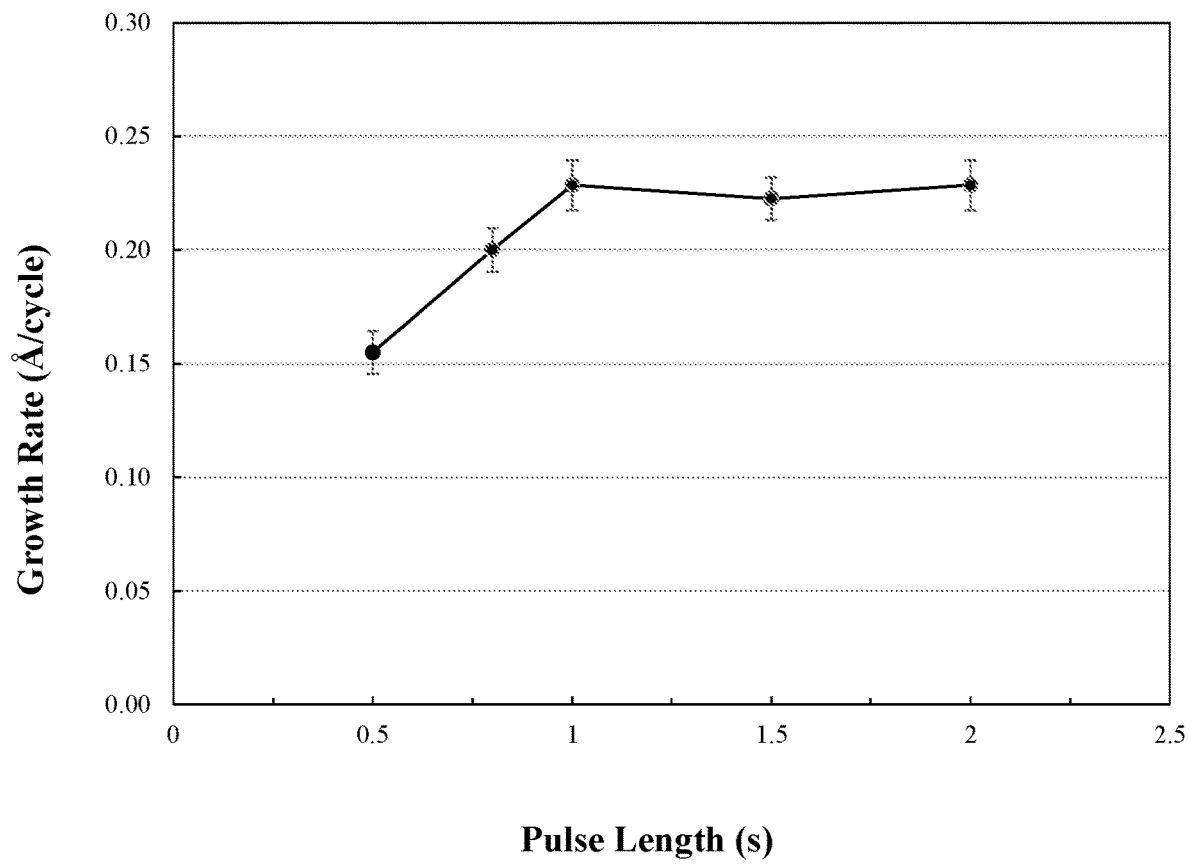
FIG. 5: Relationship between TSC pulse length and growth rate on $SiO_2$ using lower purity carrier gas.

1000 cycles were completed and an average growth rate per cycle was calculated. Temperature was kept constant at 140° C. Results are illustrated in FIG. 5.

Figure 6:
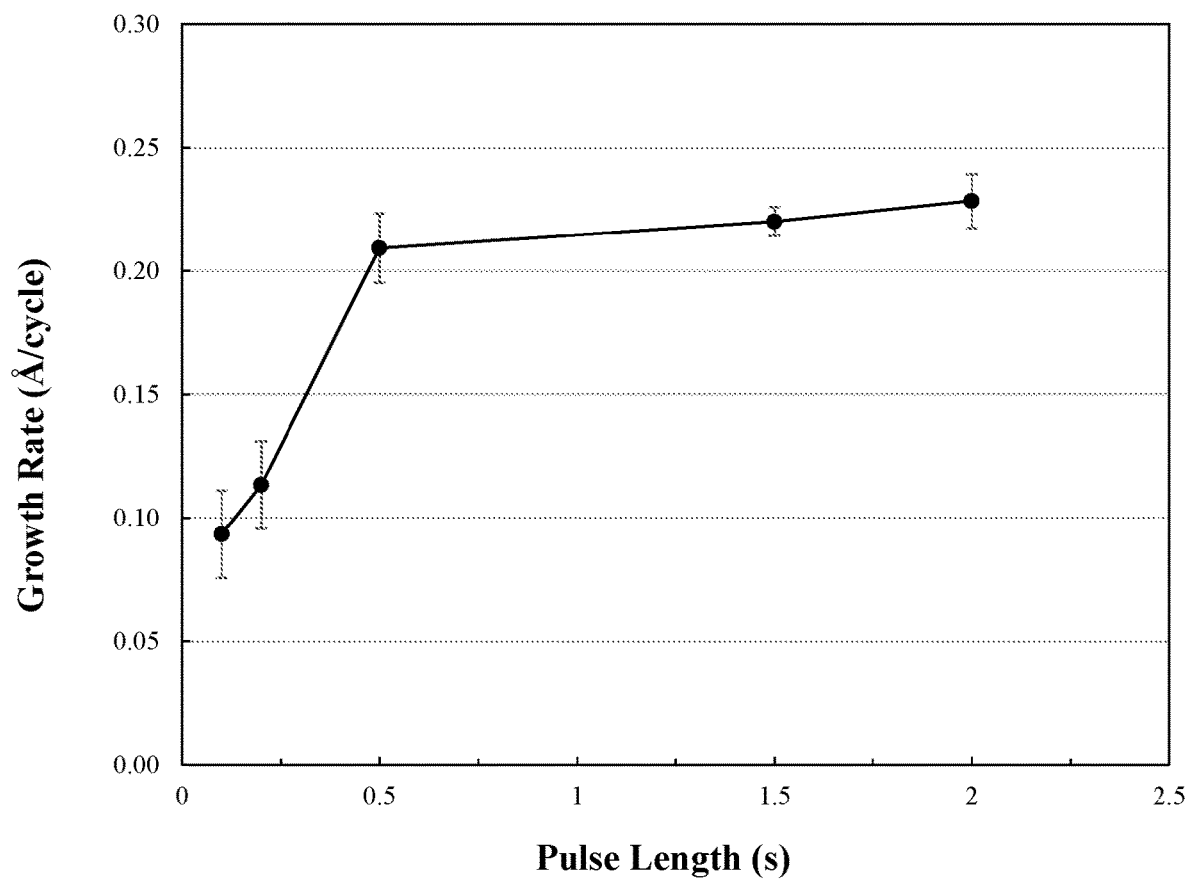
FIG. 6: Relationship between $TaCl_5$ pulse length and growth rate on $SiO_2$ using lower purity carrier gas.

Additional experiments were conducted varying $TaCl_5$ pulse length. Each cycle comprised $TaCl_5$ pulse (varying length), $TaCl_5$ purge (10 s), TSC pulse (1 s), TSC purge (5 s). 1000 cycles were completed and an average growth rate per cycle was calculated. Temperature was kept constant at 140° C. Results are illustrated in FIG. 6.

Figure 7A:
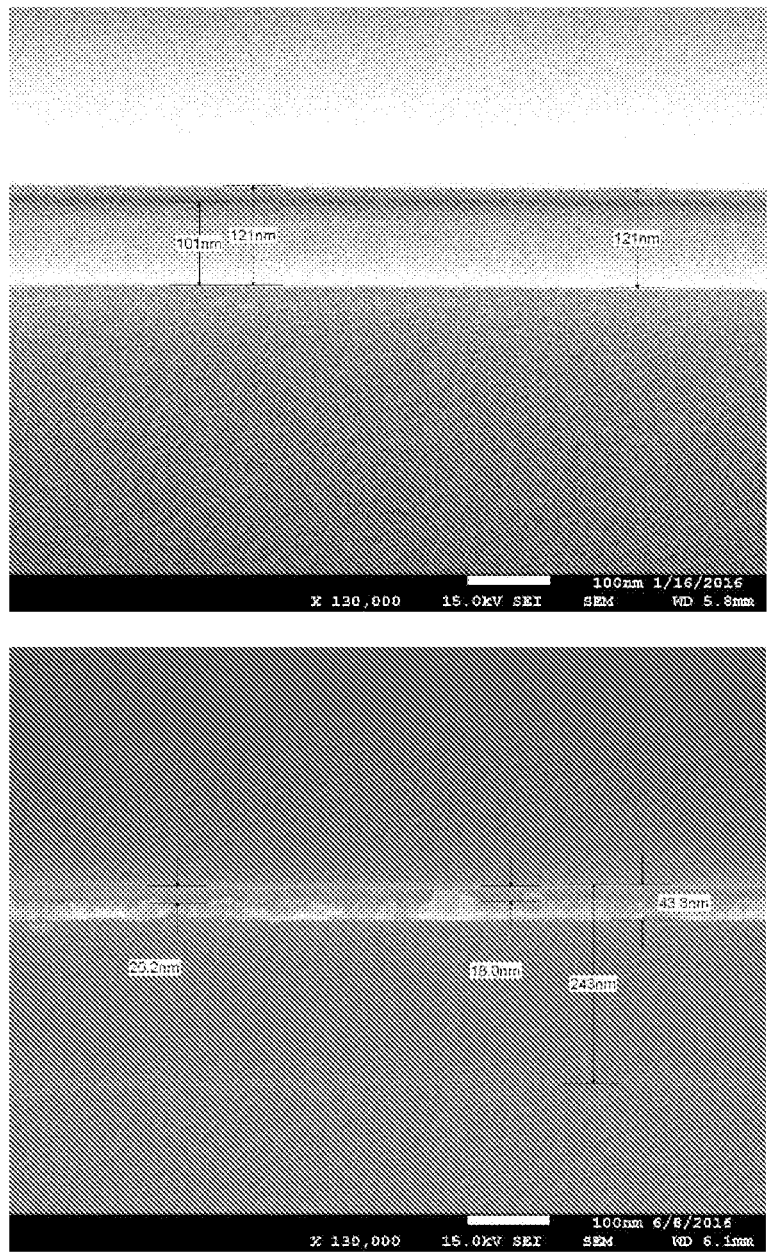
FIG. 7A: scanning electron micrographs of ALD film from TSC+$TaCl_5$ in lower purity carrier gas.
Figure 7B:
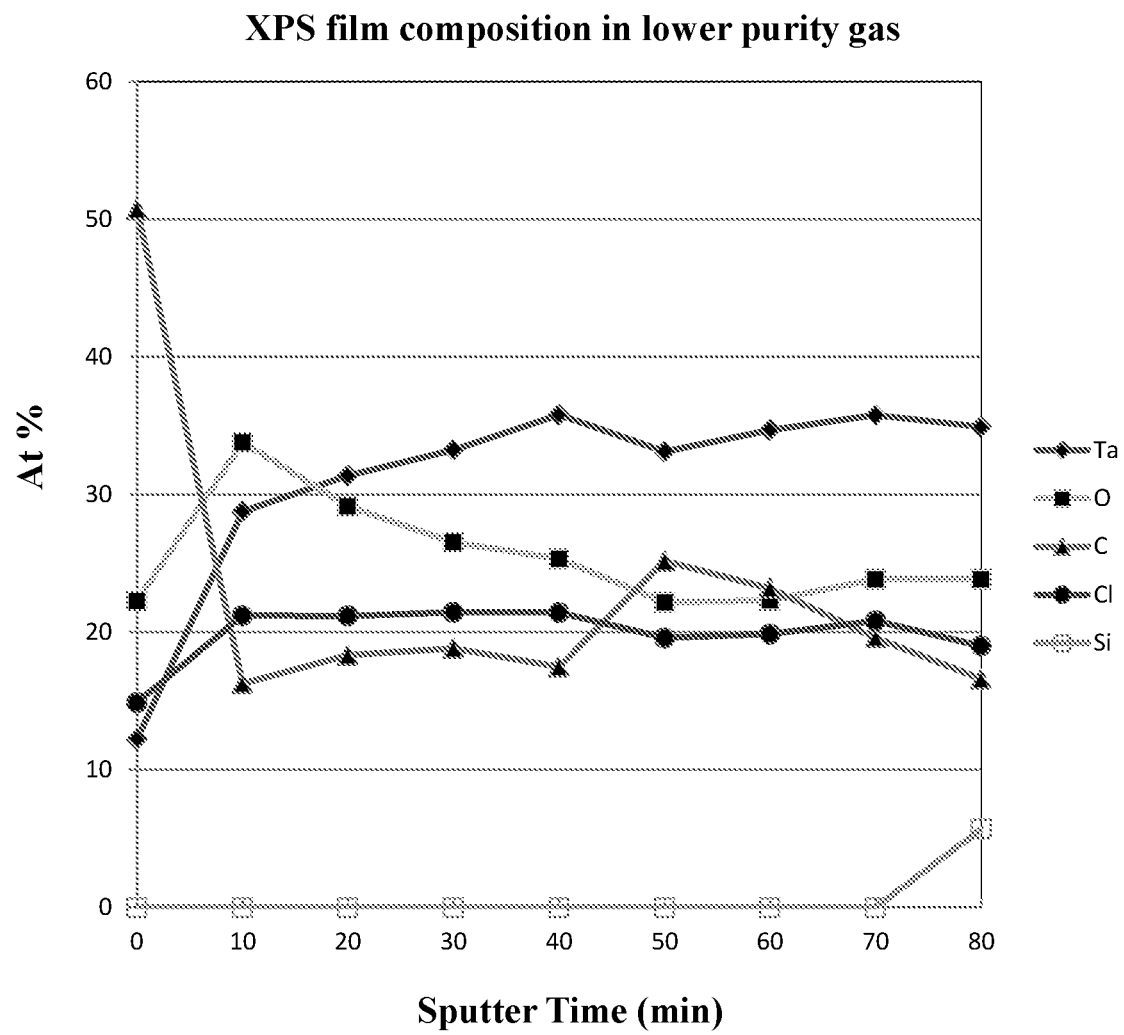
FIG. 7B: X-ray photoelectron spectroscopy (XPS) film composition after ALD of TSC+$TaCl_5$ in lower purity carrier gas.

XPS film composition was determined for a 30 nm thick film with a deposition temp of 140° C. on $SiO_2$ substrate. Ar ion sputtering occurred at 4 keV and scans were taken at 10 minute intervals for 80 minutes. Films were exposed to air for analysis. After sputtering, composition was disclosed to be 29-36% Ta, 16-25% C, 19-22% Cl, 22-34% O (FIG. 7B). Films were evidently heavily contaminated. Carbon and chlorine contamination may have two possible originals. Hydrogen atom transfer could be slower than expected or $O_2$ contamination in carrier gas reaction with $TaCl_5$ may be presenting possibly forming less reactive $TaO_xCl_y$ species. FIG. 7A provides scanning electron micrographs of ALD film from $TSC+TaCl_5$ in lower purity carrier gas.

Figure 8:
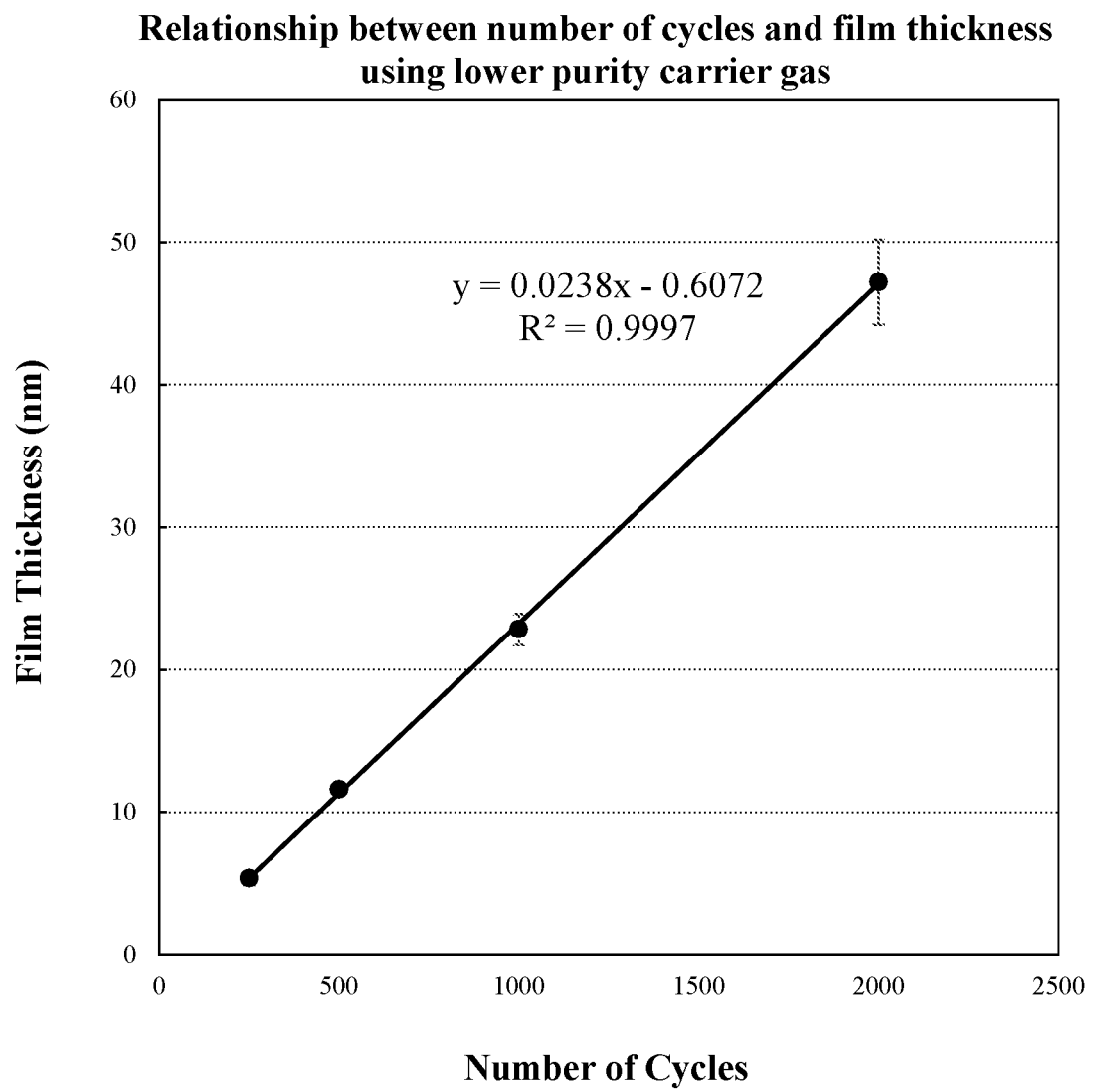
FIG. 8: Relationship between number of cycles and film thickness using lower purity carrier gas and a 5 s TSC purge length.
Figure 9:
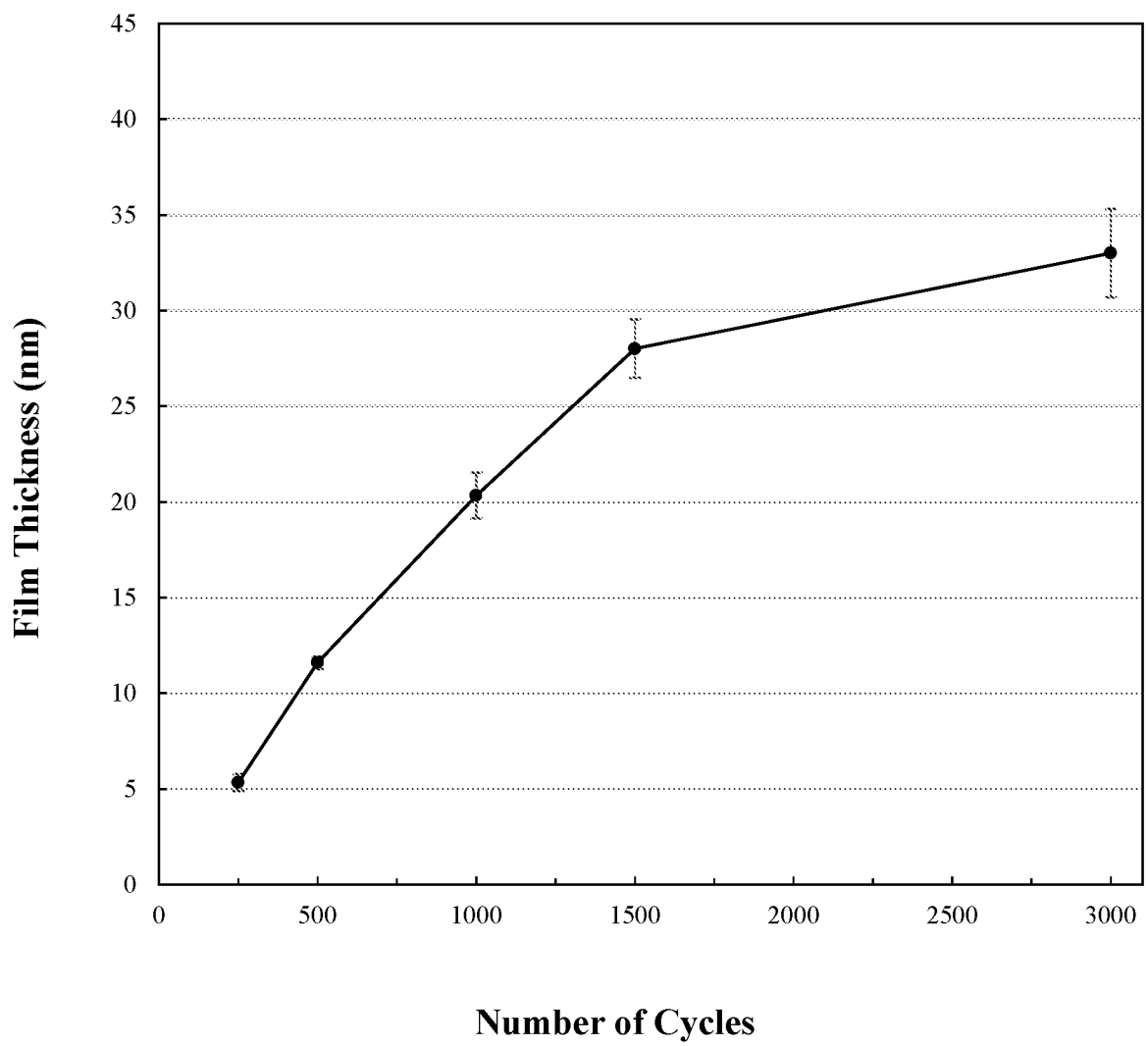
FIG. 9: Relationship between number of cycles and film thickness using lower purity gas and a 10 s TSC purge length.

Additional experiments were conducted varying number of cycles to observe the effect on thickness. Experiments were carried out at various cycle lengths comprising $TaCl_5$ pulse (2 s), $TaCl_5$ purge (10 s), TSC pulse (1 s), and TSC purge (5 s) on ~100 nm of $SiO_2$/Si. Temperature was kept constant at 140° C. Results illustrated no obvious nucleation delay. (FIG. 8) Experiments were also conducted comprising $TaCl_5$ pulse (2 s), $TaCl_5$ purge (10 s), TSC pulse (1 s), and TSC purge (10 s) where TSC ampoule temperature was 23° C. and $TaCl_5$ source temperature was 100° C. (FIG. 9).

Film thickness was observed at greater number of cycles when TSC temperature was kept constant at 140° C. Experiments comprised $TaCl_5$ pulse (2 s), $TaCl_5$ purge (10 s), TSC pulse (1 s), and TSC purge (5 s) on ~100 nm of $SiO_2$/Si. Results are summarized in Table 2 below.

TABLE 2

Relationship between thickness and number of cycles at 140° C.

| Number of Cycles | Film Thickness (nm) | Growth Rate (Å/cycle) | Number of Trials |
|---|---|---|---|
| 2000 | 47.2 ± 2.97 nm | 0.236 | 1 |
| 2500 | 47.0 ± 1.15 nm | 0.188 | 1 |
| 3000 | 31.6 ± 1.60 nm | 0.106 | 3 |

Film thickness was observed at greater number of cycles when TSC temperature was kept constant at 130° C. Experiments comprised $TaCl_5$ pulse (2 s), $TaCl_5$ purge (10 s), TSC pulse (1 s), and TSC purge (5 s) on ~100 nm of $SiO_2$/Si. Results are summarized in Table 3 below.

TABLE 3

Relationship between thickness and number of cycles at 130° C.

| Number of Cycles | Film Thickness (nm) | Growth Rate (Å/cycle) | Number of Trials |
|---|---|---|---|
| 1000 | 22.3 ± 0.005 nm | 0.223 | 1 |
| 3000 | 71.3 ± 2.25 nm | 0.238 | 1 |

A possible explanation for the disparity between film thicknesses at 130° C. compared to 140° C. given the same number of cycles is that films could be etched by HCl by-product. This effect would be more pronounced at a higher temperature. After the reaction of HCl with $TaCl_x$*, higher temperatures would drive desorption. A higher temperature would also favor production of HCl over $H_2$.

Figure 10:
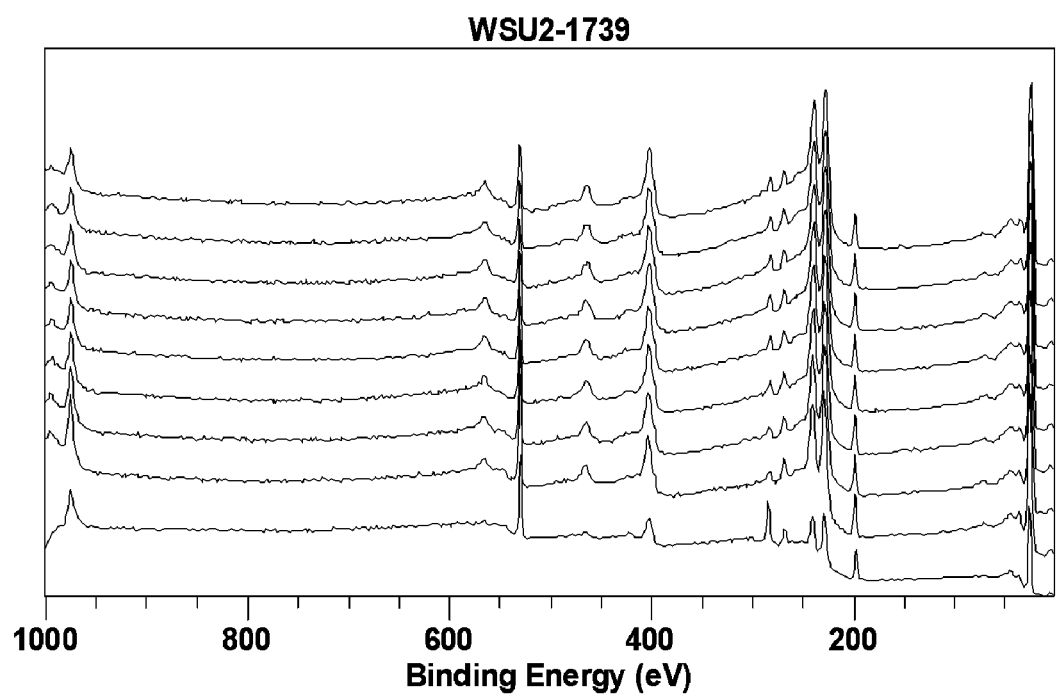
FIG. 10: XPS-Survey Scan/Depth Profiling.

Films were analyzed by (XPS) after 3000 cycles when TSC was at 130° C. Al Kα X-ray source at 8 mA and 14 kV. 4 keV $Ar^+$ ion sputtering was used for depth profiling, scans taken at 10 min intervals (0-80 min). Results are shown in FIG. 10.

Reducing C and Cl contamination may be achieved by depositing at a higher temperature. Volatile $TaOCl_x$ formation is likely the reason for reduced growth at temperatures greater than 150° C. Oxygen coming from either the $SiO_2$ substrate or carrier gas is likely the cause of this. A longer TSC purge can also reduce C and Cl contamination. Using PDMAT as the precursor eliminates Cl contamination entirely, Post-deposition cooling may occur inside the chamber as opposed to load lock. Film growth for 3000 cycles appears to be steady at ~30 nm when the film is immediately transferred from the hot reactor chamber to the lock load. Allowing the film to cool inside the reactor chamber to near room temperature resulted in oxidation leading to increased film thickness. Results are illustrated in Table 4 below.

TABLE 4

Relationship between thickness and number of cycles at various TSC temperatures

| Number of Cycles | 130° C. (n trials) | 140° C. (n trials) | 150° C. (n trials) |
|---|---|---|---|
| 1000 | 22.7 ± 0.33 nm (1) | 21.9 ± 1.92 nm (3) | 21.40 ± 1.20 nm (1) |
| 1500 | | 28.8 ± 1.52 nm (1) | |
| 2000 | | 47.2 ± 2.97 nm (1) | |
| 2500 | | 47.0 ± 1.15 nm (1) | |
| 3000 | 28.9 ± 2.41 nm (2) | 30.9 ± 0.97 nm (3) | |
| 3000 (cooled in chamber) | 71.3 ± 2.91 nm (1) | 70.0 ± 9.86 nm (1) | 67.2 ± 9.58 nm (1) |

Experiments conducted using $TaCl_5$ and TSC at 180° C. on Pt substrate resulted in film thickness of 29.0±4.6 nm and a growth rate of 0.097 Å per cycle. The growth rate on Pt substrate is slightly higher than the growth rate on $SiO_2$ substrate at 180° C., 0.097 Å per cycle and 0.065 Å per cycle, respectively.

ii. Higher Purity Carrier Gas Study

High purity carrier gas experiments followed the same cycle as low purity carrier gas experiments. ALD cycles comprise $TaCl_5$ pulse (2 s), $TaCl_5$ purge (10 s), TSC pulse (1 s), and TSC purge (10 s). TSC ampoules are delivered at 23° C. $TaCl_5$ is delivered at 100° C.

ALD cycles were conducted using higher purity carrier gas from SAES in-line gas purifier (>99.99999% $N_2$). Films were non-conductive by four-point probe after air exposure. Samples on $SiO_2$ substrate exhibited a growth rate ~0.35 Å per cycle. This growth rate was higher than that of the lower purity carrier gas which had a growth rate of ~0.21 Å per cycle. Similar growth rates for the higher purity carrier gas occurred on Pt, Ru, TiN, TaN, Si and Si—H substrates.

Figure 12:
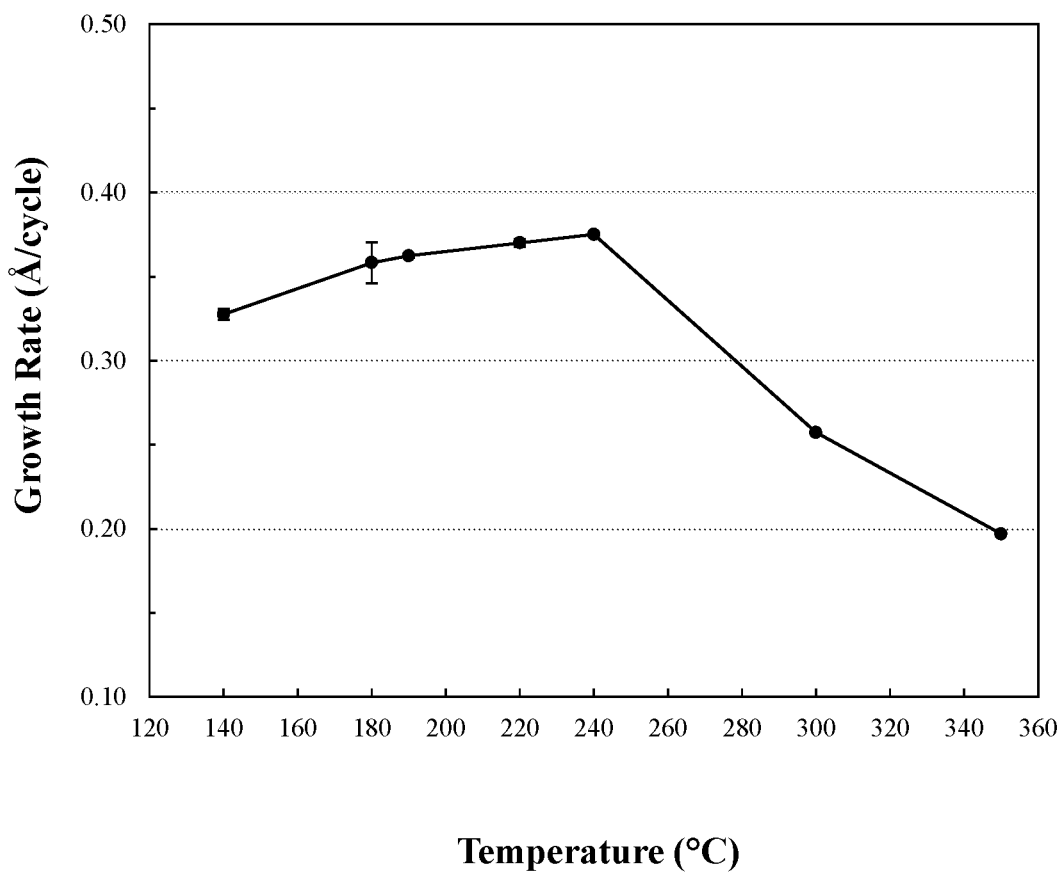
FIG. 12: Relationship between temperature and growth rate on $SiO_2$ substrate using higher purity carrier gas.
Figure 13A:
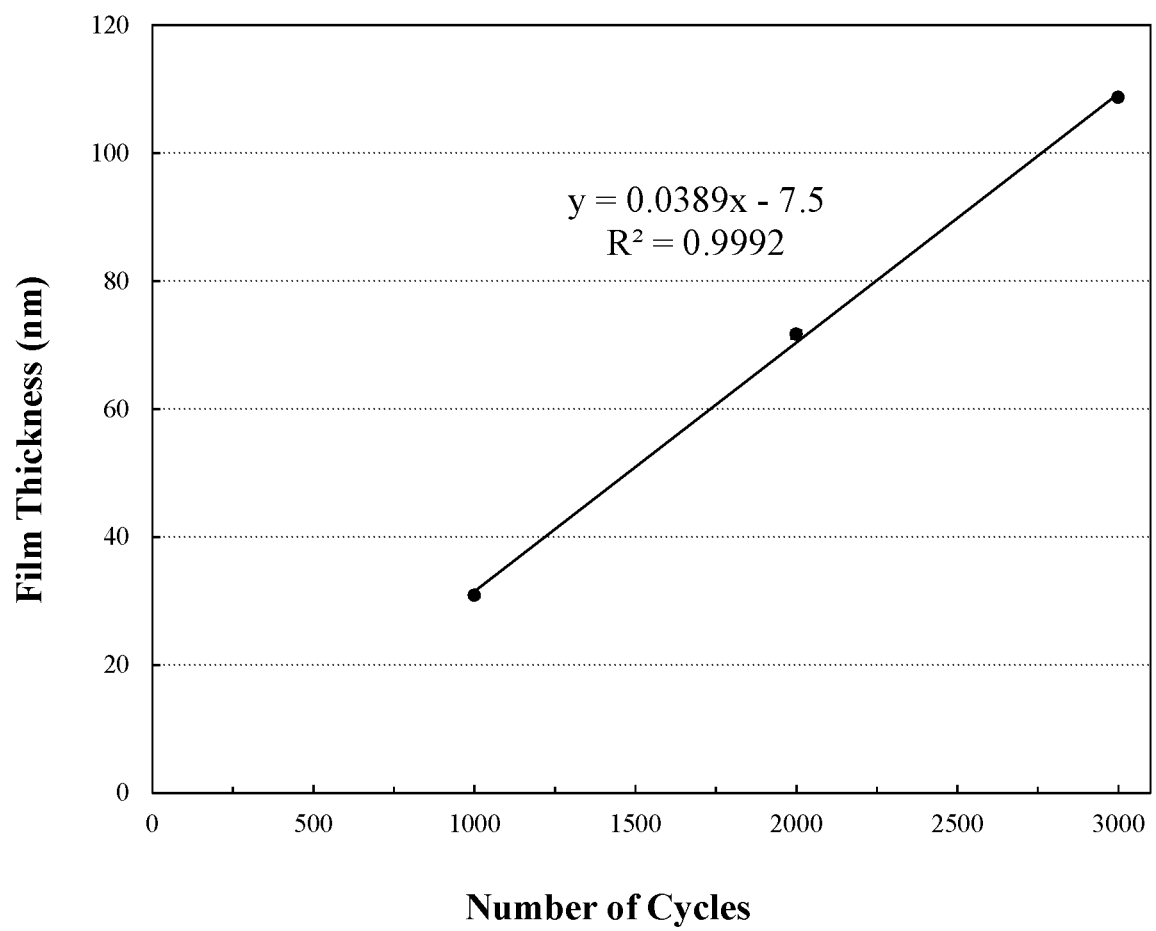
FIG. 13A: Relationship between number of cycles and film thickness on $SiO_2$ using higher purity carrier gas.
Figure 13B:
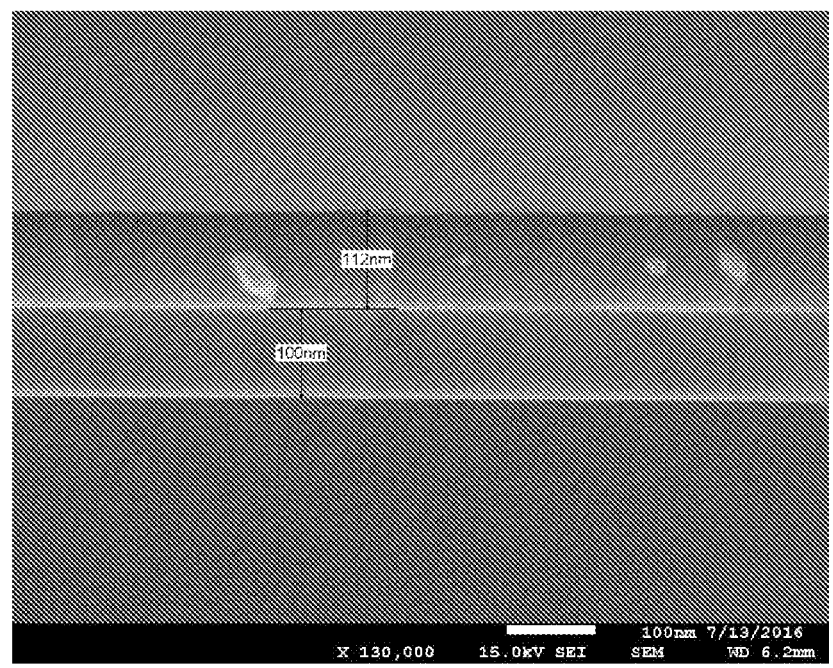
FIG. 13B: scanning electron micrographs of tantalum film on $SiO_2$.

Additional experiments were conducted varying temperature and number of cycles. Results in FIG. 12 illustrate the effect of temperature on growth rate. Results in FIG. 13A illustrate the effect the number of cycles on film thickness. FIG. 13B provides scanning electron micrographs of tantalum film on $SiO_2$.

Figure 11:
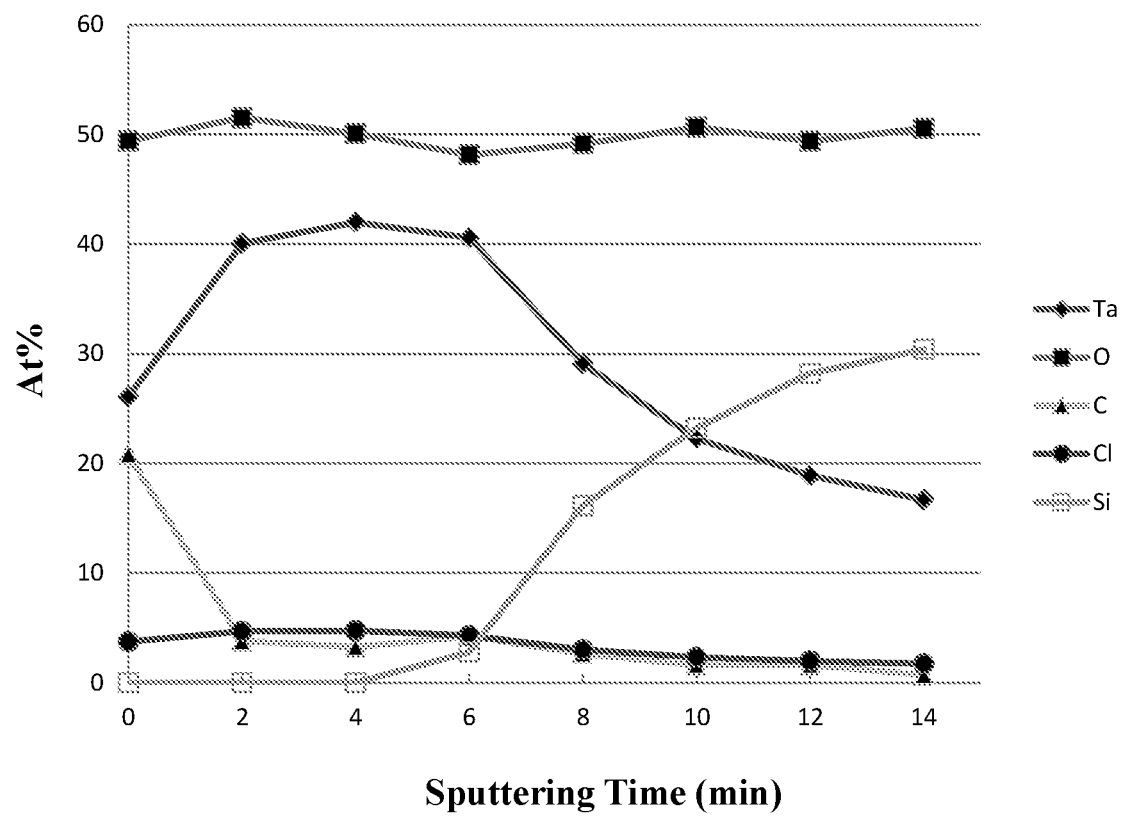
FIG. 11: XPS film composition at 180° C. after ALD of TSC+$TaCl_5$ in higher purity carrier gas.

XPS film composition was determined for a 35 nm thick film with a deposition temperature of 180° C. on $SiO_2$ substrate after 1000 cycles. Ar ion sputtering occurred at 4 keV and scans were taken at 10 minute intervals. Films were exposed to air for analysis. After sputtering, composition was disclosed to be 42% Ta, 4% C, 5% Cl, 50% O. (FIG. 11) Films were much less contaminated with C and Cl than lower purity carrier gas XPS film composition.

Figure 14:
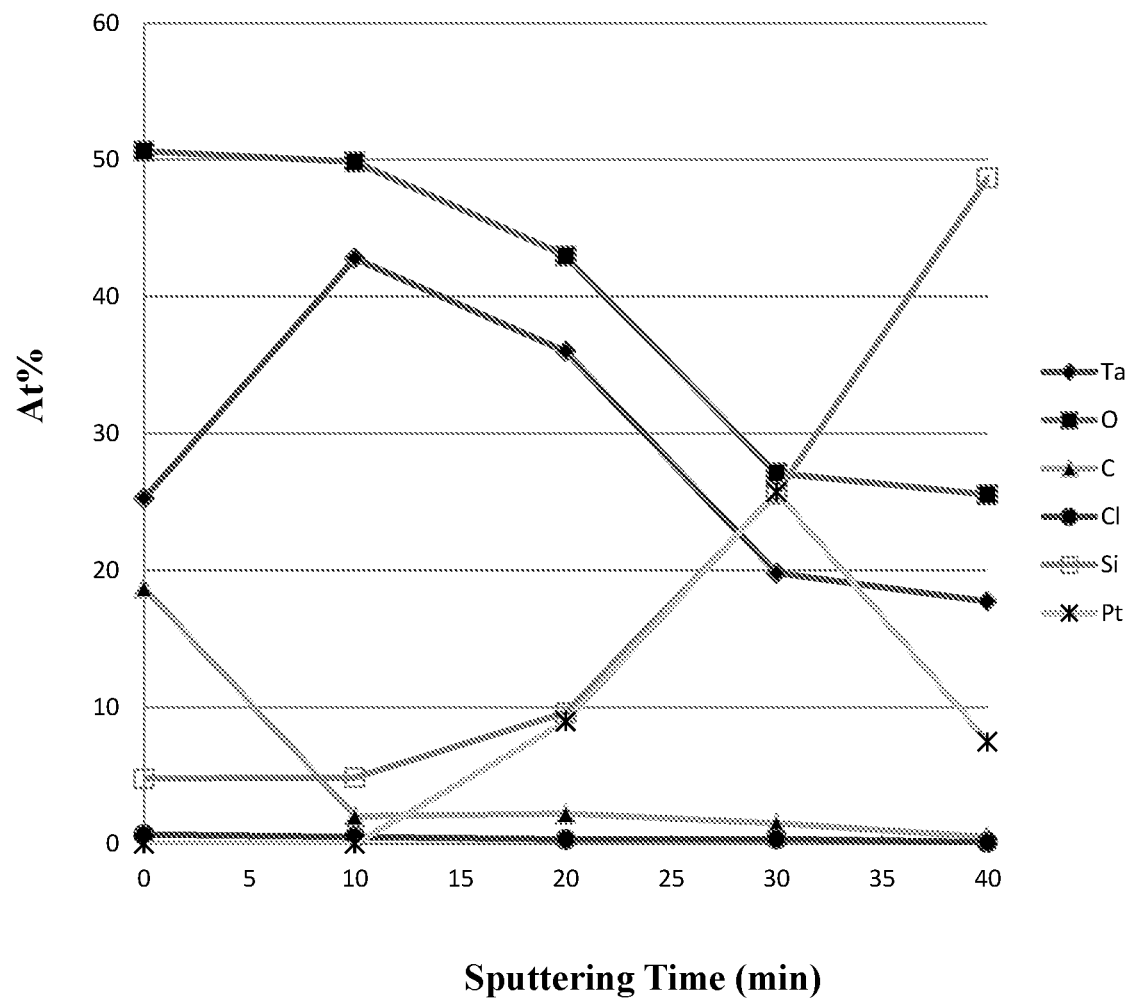
FIG. 14: XPS film composition at 300° C. after ALD of TSC+$TaCl_5$ in higher purity carrier gas.
Figure 15:
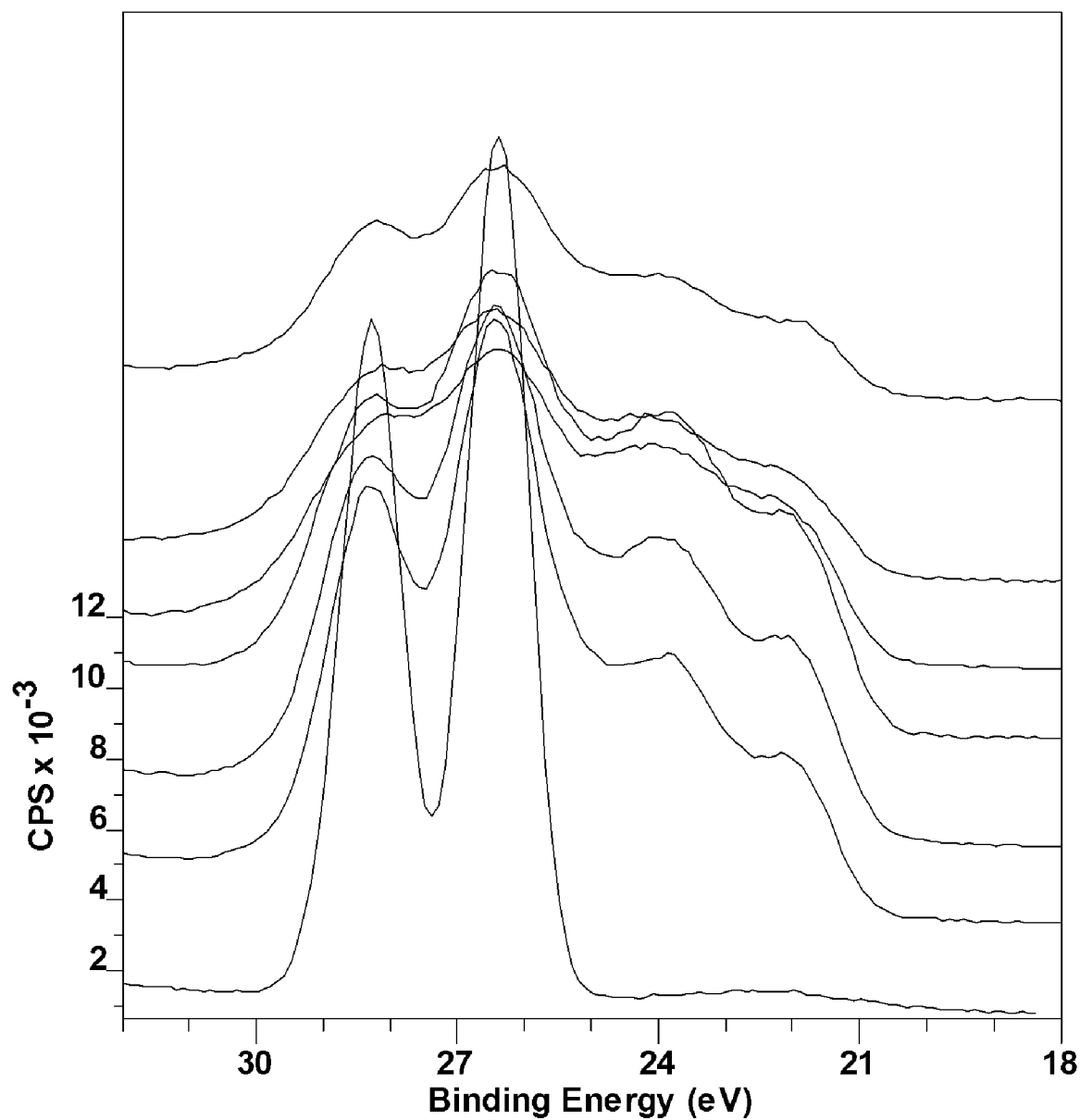
FIG. 15: Ta 4f Core Level XPS Depth Profile

XPS film composition was determined for a 60 nm thick film with a deposition temperature of 300° C. after 3000 cycles on three substrates, Pt, $Si_3N_4$, and Si. Ar ion sputtering occurred at 4 keV and scans were taken at 10 minute intervals. Films were exposed to air for analysis. After sputtering, composition was disclosed to be 43% Ta, 2% C, 0.5% Cl, 50% O, 5% Si. (FIG. 14) Cl content was reduced by an order of magnitude and C content was reduced by 50% compared to deposition temperatures of 180° C. A Ta 4f core level XPS depth profile was created and results are shown in FIG. 15.

Metallic tantalum ALD was demonstrated using $TaCl_5$ and TSC as precursors. Growth rates of ~0.35 Å per cycle are observed between 140° C. and 240° C. TSC appears to be efficient at stripping chloride ligands from $TaCl_5$ precursor, more so at higher temperatures. High purity carrier gas is essential for ALD of highly electropositive metals. TSC proves to be a promising new reducing agent for element ALD.

C. ALD Film Growth for TSC+$AlMe_3$ on Si Substrate

Experiments conducted using $AlMe_3$ and TSC at 150° C. over 1000 cycles on Si substrate showed film growth of 21.6 nm to 22.4 nm. $AlMe_3$ only at 350° C. over 1000 cycles on Si substrate showed no obvious film growth. $AlMe_3$ and 1,4-cyclohexadiene at 150° C. over 1000 cycles on Si substrate showed no obvious film. $AlMe_3$ and TSC at 200° C. over 1000 Cycles on Si substrate showed film growth of 14.4 nm.

D. ALD Film Growth for TSC+PDMAT on $SiO_2$/Si Substrate

Experiments conducted using PDMAT and TSC at 150° C. were conducted over 3000 cycles on $SiO_2$/Si substrates. Cycles comprised TSC pulse (2 s), TSC purge (5), PDMAT pulse (2.5 s), and PDMAT purge (10 s). PDMAT was delivered at 85° C. by booster. TSC was consumed at a rate of 0.062 mg per cycle. PDMAT was likely still not saturated. Film growth of 114 nm was observed.

E. ALD Film Growth for TSC+$MoCl_5$ on Ru Substrate

Experiments conducted using $MoCl_5$ and TSC at 180° C. were conducted over 1000 cycles on Ru substrates. Cycles comprised TSC pulse (2 s), TSC purge (5), $MoCl_5$ pulse (2 s), and $MoCl_5$ purge (10 s). Uneven film growth was observed ranging from 85.1 nm to 172 nm. The resistivity of the film was 516±40µΩ·cm. Bulk Mo had a resistivity of 5.47µΩ·cm While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

REFERENCES 1. (a) Knisley, T. J.; Kalutarage, L. C.; Winter, C. H. *Coord. Chem. Rev.* 2013, 257, 3222-3231. (b) Ramos, K. B.; Saly, M. J.; Chabal, Y. J. *Coord. Chem. Rev.* 2013, 257, 3271-3281. (c) Emslie, D. J. H.; Chadha, P.; Price, J. S. *Coord. Chem. Rev.* 2013, 257, 3282-3296 (d) Leskelä, M.; Ritala, M.; Nilsen, O. *MRS Bull.* 2011, 36, 877-884.

2. Kalutarage, L. C.; Martin, P. D.; Heeg, M. J.; Winter, C. H. *J. Am. Chem. Soc.* 2013, 135, 12588-12591.

3. Lim, B. S.; Rahtu, A.; Gordon, R. G. *Nat. Mater.* 2003, 2, 748-754.

4. (a) Laguerre, M.; Dunogues, J.; Calas, R.; Duffaut, N. *J. Organomet. Chem.* 1976, 112, 49-59. (b) Sulzbach, R. A.; Iqbal, A. F. M. *Angew. Chem. Int. Ed.* 1971, 10, 127. (c) Kaim, W. *J. Am. Chem. Soc.* 1983, 105, 707-713.

5. (a) Saito, T.; Nishiyama, H.; Tanahashi, H.; Kawakita, K.; Tsurugi, H.; Mashima, K. *J. Am. Chem. Soc.* 2014, 136, 5161-5170. (b) Tsurugi, H.; Tanahashi, H.; Nishiyama, H.; Fegler, W.; Saito, T.; Sauer, A.; Okuda, J.; Mashima, K. *J. Am. Chem. Soc.* 2013, 135, 5986-5989. (c) Tsurugi, H.; Saito, T.; Tanahashi, H.; Arnold, J.; Mashima, K. *J. Am. Chem. Soc.* 2011, 133, 18673-18683. (d) Arteaga-Müller, R.; Tsurugi, H.; Saito, T.; Yanagawa, M.; Oda, S.; Mashima, K. *J. Am. Chem. Soc.* 2009, 131, 5370-5371.

6. (a) "Silyl Eliminations Reactions in the Atomic Layer Deposition of Metallic First Row Transition Metal and Other Element Films," C. H. Winter, Baltic ALD 2014, Helsinki, Finland, May 12-13, 2014. (b) "Silyl Elimination Reactions in the Atomic Layer Deposition of Titanium, Zinc, and Other Element Films," C. H. Winter, J. P. Klesko, and C. T. Sirimanne, 14th International Conference on Atomic Layer Deposition, Kyoto, Japan, Jun. 15-18, 2014. (c) Klesko, J. P.; Thrush, C. M.; Winter, C. H., *Chem. Mater.* 2015, 27, 4918-4921.

7. (a) Kees, S.; Simonneau, A.; Oestreich, M. *Organometallics* 2015, 34, 790-799. (b) Sakata, K.; Fujimoto, H. *Organometallics* 2015, 34, 236-241. (c) Simmoneau, A.; Oestreich, M. *Angew. Chem. Int. Ed.* 2013, 52, 11905-11907.

8. (a) Studer, A.; Amrein, S.; Schleth, F.; Schulte, T.; Walton, J. C. *J. Am. Chem. Soc.* 2003, 125, 5726-5733. (b) Amrein, S.; Studer, A. *Helv. Chim. Acta* 2002, 85, 3559-3574. (c) Studer, A.; Amrein, S. *Angew. Chem. Int. Ed.* 2000, 39, 3030-3082.

9. Rollison, C. L., in *Comprehensive Inorganic Chemistry*; Bailar, J. C., Jr.; Emeleus, H. J.; Nyhom, R.; Trotman-Dickenson, A. F.; Pergamon Press: Oxford; 1973; Volume 3; pp 623-769. Kemmitt, R. D. W., in *Comprehensive Inorganic Chemistry*; Bailar, J. C., Jr.; Emeleus, H. J.; Nyhom, R.; Trotman-Dickenson, A. F.; Pergamon Press: Oxford; 1973; Volume 3; pp 771-876.

What is claimed is:

1. A method comprising:
   providing a vapor of a first compound having an atom in an oxidized state, the atom in an oxidized state being in an oxidation state greater than 0, the atom in an oxidized state being selected from the group consisting of Groups 2-14 of the Periodic Table, the lanthanides, As, Sb, Bi, and Te; and providing a vapor of a reducing agent, the reducing agent selected from the group consisting of compounds described by formulae I, II, and III:

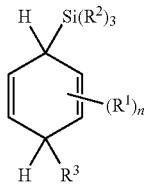

I

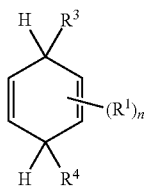

II

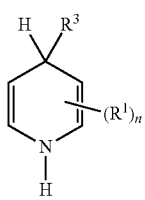

III wherein:
$R^1$, $R^2$ $R^3$, $R^4$ are each independently H, $C_{1-10}$ alkyl, $C_{6-14}$ aryl, or $C_{4-14}$ heteroaryl, and
n is 0, 1, 2, 3, or 4; and
reacting the vapor of the first compound with the vapor of the reducing agent to form a second compound having the atom in a reduced state relative to the first compound.

2. The method of claim 1 wherein $R^1$, $R^2$ are each independently H or $C_{1-10}$ alkyl.

3. The method of claim 1 wherein $R^1$, $R^2$ are each independently hydrogen, methyl, ethyl, n-propyl, isopropyl, n-butyl, sec-butyl, isobutyl, t-butyl, or phenyl.

4. The method of claim 1 wherein the atom in an oxidized state is Cu, Cr, Mn, Fe, Co, Ti, or Ni.

5. The method of claim 1 comprising a deposition cycle including:
a) contacting a substrate with the vapor of the first compound having an atom in an oxidized state to form a first modified surface; and
c) contacting the first modified surface with the vapor of the reducing agent.

6. The method of claim 5 wherein a metal-containing layer is deposited on the substrate.

7. The method of claim 6 wherein the metal-containing layer includes a metal atom in a zero oxidation state.

8. The method of claim 5 wherein the substrate is additionally contacted with the vapor of the first compound having an atom in an oxidized state and then the vapor of a reducing agent during a plurality of additional deposition cycles.

9. The method of claim 5 wherein the substrate is coated with from 1 to 5000 deposition cycles.

10. The method of claim 5 wherein the substrate is coated at a temperature from about 50 to 400° C.

11. The method of claim 5 wherein the substrate is contacted with a purge gas after contacting the substrate with vapor of a metal-containing compound including a metal atom in an oxidized state and before contacting the substrate with the vapor of the reducing agent.

12. The method of claim 11 wherein the substrate is contacted with the purge gas after contacting the substrate with the vapor of the reducing agent and before a subsequent step of the vapor of a first compound including an atom in an oxidized state.

13. The method of claim 5 wherein the first compound having an atom in an oxidized state is reacted with the reducing agent in a gaseous state.

14. The method of claim 1 wherein $R^3$, $R^4$ are each independently H.

15. The method of claim 1 wherein the reducing agent has formula 3:

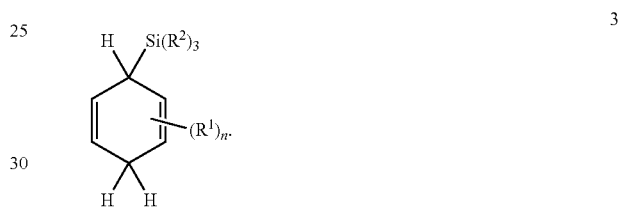

3

16. The method of claim 1 wherein the reducing agent has formula 4:

4

17. The method of claim 1 wherein the reducing agent has formula 6:

6

* * * * *